US012522912B2

(12) United States Patent
Fukuyama et al.

(10) Patent No.: US 12,522,912 B2
(45) Date of Patent: Jan. 13, 2026

(54) SURFACE TREATMENT DEVICE

(71) Applicant: Shibaura Machine Co., Ltd., Chiyoda-ku (JP)

(72) Inventors: Satoshi Fukuyama, Numazu (JP); Yoshiaki Kurihara, Sunto-gun (JP); Takeshi Namba, Sunto-gun (JP); Koichi Nose, Osaka (JP)

(73) Assignee: Shibaura Machine Co., Ltd., Chiyoda-ku (JP)

( * ) Notice: Subject to any disclaimer, the term of this patent is extended or adjusted under 35 U.S.C. 154(b) by 102 days.

(21) Appl. No.: 17/642,480

(22) PCT Filed: Sep. 17, 2020

(86) PCT No.: PCT/JP2020/035341

§ 371 (c)(1),
(2) Date: Mar. 11, 2022

(87) PCT Pub. No.: WO2021/060160

PCT Pub. Date: Apr. 1, 2021

(65) Prior Publication Data

US 2022/0307122 A1 Sep. 29, 2022

(30) Foreign Application Priority Data

Sep. 25, 2019 (JP) ................................ 2019-173700

(51) Int. Cl.
*C23C 14/34* (2006.01)
*C23C 4/134* (2016.01)
(Continued)

(52) U.S. Cl.
CPC .............. *C23C 14/34* (2013.01); *C23C 4/134* (2016.01); *H01J 37/32715* (2013.01);
(Continued)

(58) Field of Classification Search
CPC ....... C23C 14/34; C23C 14/223; C23C 14/50; C23C 14/02; C23C 14/35; C23C 14/505;
(Continued)

(56) References Cited

U.S. PATENT DOCUMENTS 5,320,877 A * 6/1994 Nakaue ................ C23C 14/505
427/523
2009/0065741 A1* 3/2009 Walls .................... C23C 14/086
204/192.15

FOREIGN PATENT DOCUMENTS

CN 1317393 A 10/2001
CN 1873047 A 12/2006
(Continued)

OTHER PUBLICATIONS

Machine Translation JP 2009-079251 (Year: 2009).*
(Continued)

*Primary Examiner* — Rodney G McDonald
(74) *Attorney, Agent, or Firm* — Oblon, McClelland, Maier & Neustadt, L.L.P.

(57) ABSTRACT

A surface treatment device includes a housing unit, a surface treatment element, and a stirring element. The housing unit houses a workpiece. The surface treatment element performs surface treatment on the workpiece housed in the housing unit. The stirring element stirs the workpiece when the surface treatment element performs the surface treatment on the workpiece.

13 Claims, 25 Drawing Sheets

(51) Int. Cl.
*H01J 37/32* (2006.01)
*H01J 37/34* (2006.01)

(52) U.S. Cl.
CPC ........ *H01J 37/32733* (2013.01); *H01J 37/34* (2013.01); *H01J 37/3488* (2013.01)

(58) Field of Classification Search
CPC ......... C23C 4/134; B01J 19/08; B01J 19/088; B01J 2219/0894; H05H 1/46; H01J 37/32715; H01J 37/32733; H01J 37/34; H01J 37/3411; H01J 37/3488
USPC ............................. 204/298.24; 118/718, 729
See application file for complete search history.

(56) References Cited

FOREIGN PATENT DOCUMENTS

| | | | | |
|---|---|---|---|---|
| CN | 101525739 | A | | 9/2009 |
| CN | 102605316 | A | | 7/2012 |
| DE | 41 41 805 | | * | 6/1993 |
| JP | 61-83449 | U | | 6/1986 |
| JP | 2004-261747 | A | | 9/2004 |
| JP | 1764522 | A | | 4/2006 |
| JP | 2007-204786 | A | | 8/2007 |
| JP | 2009-79251 | A | | 4/2009 |
| JP | 5768890 | B2 | | 8/2015 |
| JP | 2016-084445 | A | | 5/2016 |
| JP | 2018-021220 | A | | 2/2018 |
| WO | WO 2010/142963 | | * | 12/2010 |
| WO | WO 2012/018075 | A1 | | 2/2012 |

OTHER PUBLICATIONS

Machine Translation DE 41 41 805 (Year: 1993).*
Machine Translation WO 2010/142953 (Year: 2010).*
Combined Chinese Office Action and Search Report issued on Feb. 11, 2023 in Chinese Patent Application 202080067569.3 (with English translation), 16 pages.
International Search Report issued Nov. 24, 2020 in PCT/JP2020/035341 filed Sep. 17, 2020, 2 pages.
Chinese Office Actino issued in Chinese Patent Application No. 202080067569.3 on Oct. 10, 2024, (w/ English Translation).
Chinese Office Action issued in Chinese Patent Application No. 202080067569.3 on Jan. 13, 2025, w/ English Translation.

* cited by examiner (a)

(b)

SURFACE TREATMENT DEVICE

CROSS-REFERENCE TO RELATED APPLICATIONS

This application is a national stage application of International Application No. PCT/JP2020/035341, filed Sep. 17, 2020, which designates the United States, incorporated herein by reference, and which claims the benefit of priority from Japanese Patent Application No. 2019-173700, filed Sep. 25, 2019, the entire contents of which are incorporated herein by reference.

TECHNICAL FIELD

The present invention relates to a surface treatment device that performs surface treatment such as irradiation of a workpiece with plasma.

BACKGROUND ART

Conventionally, a surface treatment device that performs cleaning and modification of a surface of a workpiece by using plasma to form a metal catalyst layer, a functional group, or the like, and a surface treatment device that performs sputtering by using a sputtering device are known.

For example, in a plasma film-forming device described in Patent Document 1, a plurality of substrate holders used as anode electrodes are installed, and a plurality of cathode electrodes are formed between the plurality of substrate holders. Then, by introducing process gas between the electrodes and supplying alternating current (AC) power between the electrodes, the process gas in a plasma state is used to generate a thin film on a substrate.

CITATION LIST

Patent Literature

Patent Document 1: JP 5768890 B2

SUMMARY OF INVENTION

Problem to be Solved by the Invention

The plasma film-forming device of Patent Document 1 is suitable for forming a thin film on a large amount of thin plate-shaped components, but cannot uniformly irradiate a surface of a small three-dimensional component with plasma, and thus cannot uniformly form a film on the entire surface of the small three-dimensional component.

The present invention has been made in view of the above, and it is an object to provide a surface treatment device that can uniformly perform surface treatment on an entire surface even in a case where a workpiece to be subjected to the surface treatment has a small three-dimensional shape.

Means for Solving Problem

In order to solve the above problem and achieve the object, A surface treatment device according to the present invention include: a housing unit which houses a workpiece; a surface treatment means which performs surface treatment on the workpiece housed in the housing unit; and a stirring means which stirs the workpiece when the surface treatment means performs the surface treatment on the workpiece.

Effect of the Invention

The surface treatment device according to the present invention has an effect that even in a case where a workpiece to be subjected to surface treatment is a small three-dimensional component, the surface treatment can be uniformly performed on the entire surface.

DESCRIPTION OF EMBODIMENTS

Hereinafter, exemplary embodiments of a surface treatment device according to the present disclosure will be described in detail with reference to the drawings. Note that the present invention is not limited by the embodiments. In addition, constituent elements in the following embodiments include those that can be replaced and can be easily conceived by those skilled in the art, or those that are substantially the same.

1. First Embodiment

A first embodiment of the present disclosure is an example of a surface treatment device 1*a* that generates a functional group on a surface of a workpiece W by irradiating the surface of the workpiece W formed of, for example, a resin material, with plasma, and then forms a thin film by performing sputtering on the surface of the workpiece W on which adhesion of a film is improved by generation of the functional group.

1-1. Description of Configuration of Surface Treatment Device

Figure 1:
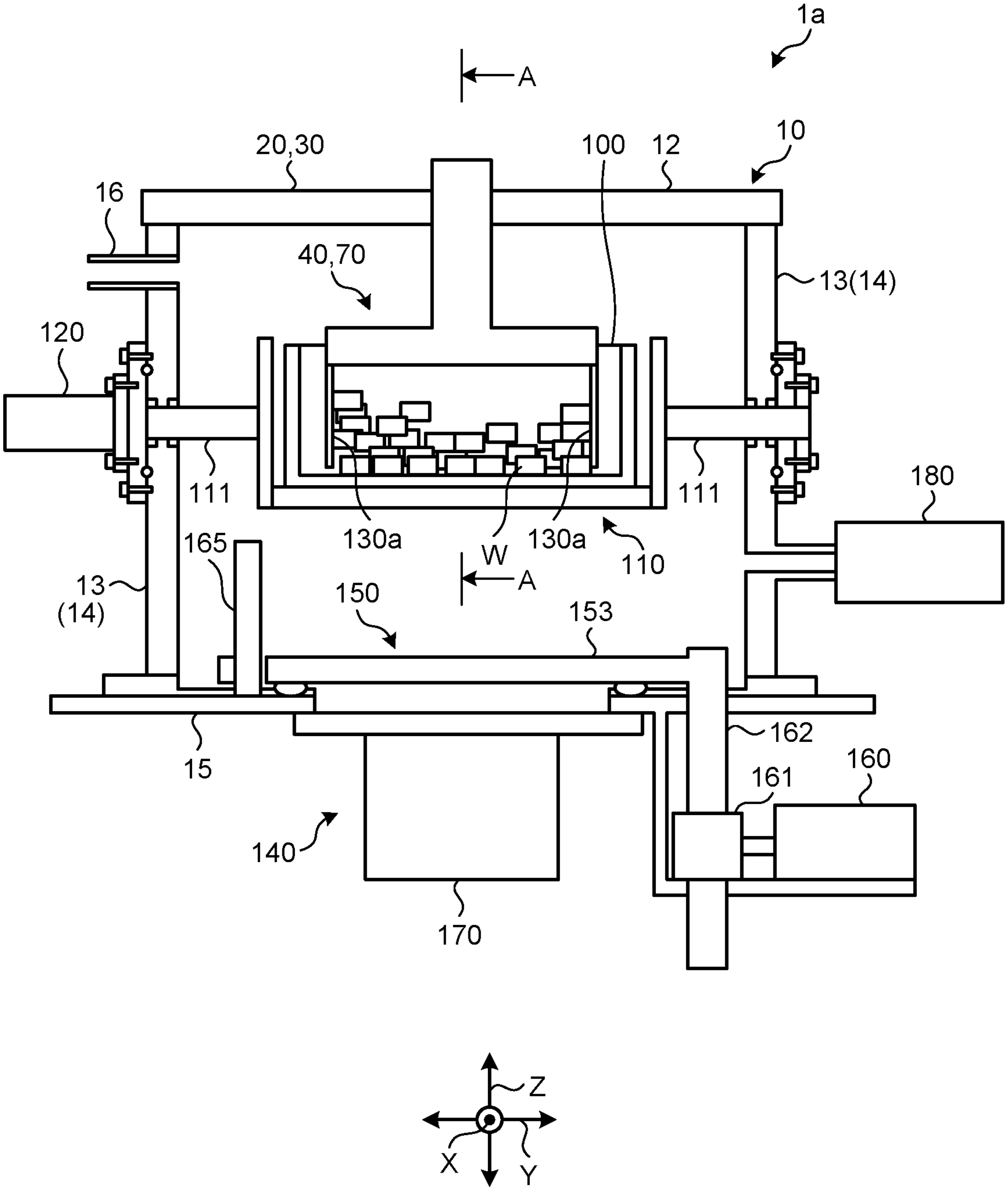
FIG. 1 is a schematic view illustrating a device configuration of a surface treatment device according to a first embodiment.
Figure 2:
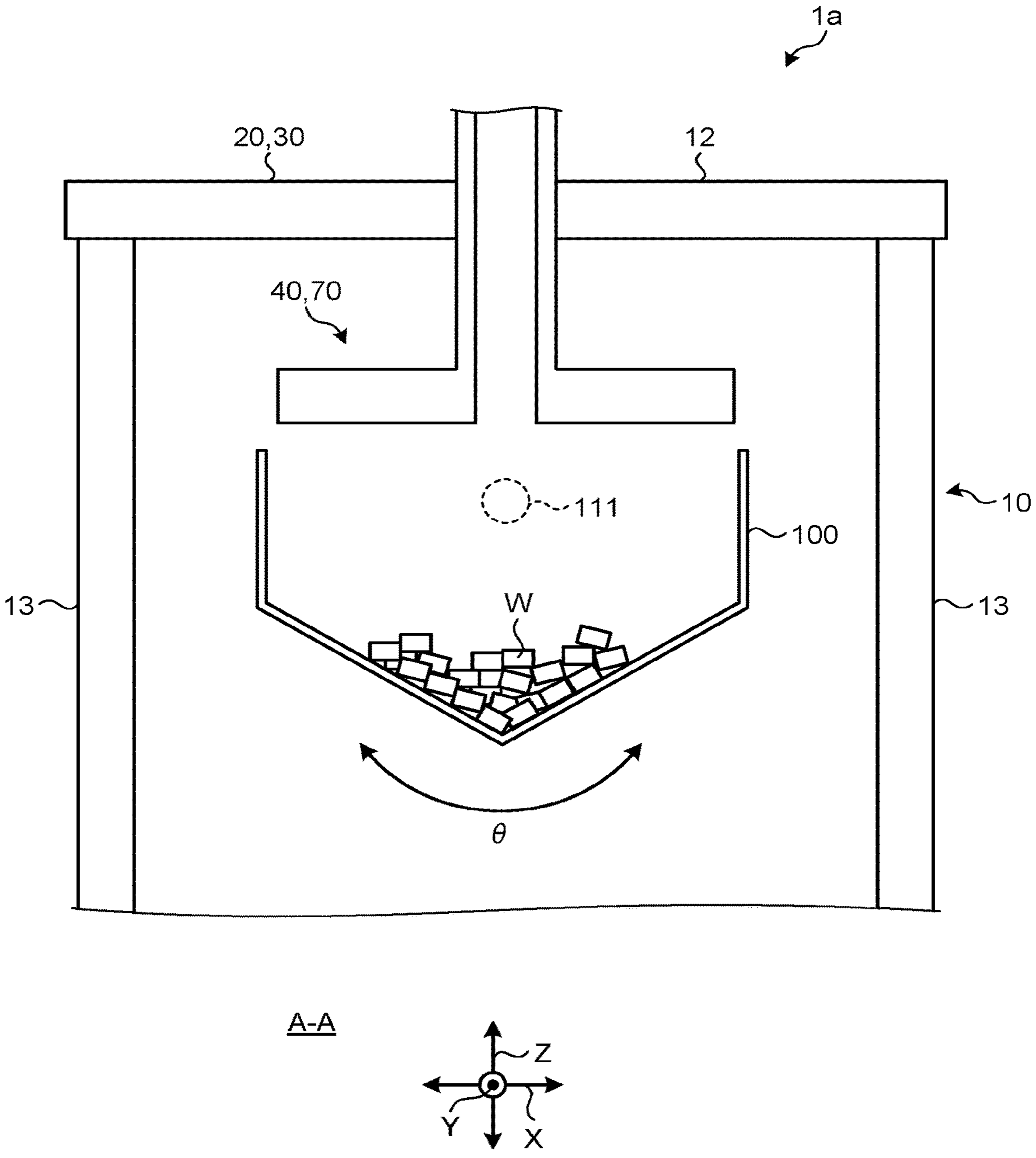
FIG. 2 is a schematic cross-sectional view taken along line A-A of FIG. 1.

FIG. 1 is a schematic view illustrating a device configuration of the surface treatment device according to the first embodiment. FIG. 2 is a schematic cross-sectional view taken along line A-A of FIG. 1. Note that, in the following description, a vertical direction in a normal use state of the surface treatment device 1*a* will be described as a vertical direction Z in the surface treatment device 1*a*, an upper side in the normal use state of the surface treatment device 1*a* will be described as an upper side in the surface treatment device 1*a*, and a lower side in the normal use state of the surface treatment device 1*a* will be described as a lower side in the surface treatment device 1*a*. In addition, a horizontal direction in the normal use state of the surface treatment device 1*a* will be described as a horizontal direction in the surface treatment device 1*a*. Furthermore, in the horizontal direction, an extending direction of a swing shaft 111 of a housing unit support member 110 will be described as a length direction Y in the surface treatment device 1*a*, and a direction orthogonal to both the vertical direction Z and the length direction Y of the surface treatment device 1*a* will be described as a width direction X in the surface treatment device 1*a*.

The surface treatment device 1*a* according to the present embodiment includes a chamber 10 formed so as to be able to house a workpiece W therein, a plasma generation device 40 as an example of a surface treatment means that performs surface treatment on the workpiece W, a sputtering device 70 as an example of a surface treatment means that performs surface treatment different from that of the plasma generation device 40 on the workpiece W, a housing unit 100 that houses the workpiece W, and a pump unit 140 that reduces a pressure in the chamber 10. Note that the workpiece W is a small three-dimensional workpiece formed of a resin material such as a plastic resin.

The plasma generation device 40 generates plasma and irradiates the workpiece W with the generated plasma to perform surface treatment on the workpiece W. More specifically, a functional group is generated by irradiating the surface of the workpiece W with plasma. As a result, when a thin film serving as a base for plating is generated on the surface of the workpiece W in the subsequent step, adhesion of the thin film is improved.

The sputtering device 70 performs sputtering on the workpiece W subjected to surface treatment by the plasma generation device 40 to perform surface treatment for forming the thin film serving as the base for plating on the workpiece W. Note that, as the plasma generation device 40 and the sputtering device 70 are switched to be disposed in the chamber 10 as will be described later, the plasma generation device 40 and the sputtering device 70 can perform different surface treatments on the same workpiece W (see FIGS. 3 and 4).

Note that FIGS. 1 and 2 are schematic views illustrating a positional relationship in the chamber 10 in a case where the plasma generation device 40 or the sputtering device 70 is positioned in the chamber 10, and thus, can be applied regardless of whether the device positioned in the chamber 10 is the plasma generation device 40 or the sputtering device 70. The chamber 10 is formed in a hollow substantially rectangular parallelepiped shape, and the plasma generation device 40 and the sputtering device 70 are attached to an upper wall 12 which is an upper wall surface and are disposed in the chamber 10. In the chamber 10, a gas inflow portion 16 through which gas used for performing sputtering by the sputtering device 70 flows into the chamber 10 is disposed in a side wall 13 of the chamber 10.

In addition, the housing unit 100 is provided in the chamber 10 in a state of being supported by the housing unit support member 110. As a result, the chamber 10 can house the workpiece W therein.

Correction plates 130*a* are installed inside the housing unit 100. The correction plates 130*a* are installed in the plasma generation device 40 and the sputtering device 70. Two correction plates 130*a* are installed in a state of facing each other with an interval substantially equal to dimensions of the plasma generation device 40 and the sputtering device 70 in the length direction Y. When the workpiece W is housed in the housing unit 100, the correction plates 130*a* limit a range in which the workpiece W is housed to a region between the two correction plates 130*a*. That is, the housing range of the workpiece W is corrected (limited) from the entire region of the housing unit 100 to the region between the two correction plates 130*a*.

Note that, as illustrated in FIG. 2, a dimension of the housing unit 100 in the width direction X is substantially equal to dimensions of the plasma generation device 40 and the sputtering device 70 in the width direction X. Therefore, when the workpiece W is housed in the housing unit 100, the range in which the workpiece W is housed in the width direction X is limited to a range substantially equal to the dimensions of the plasma generation device 40 and the sputtering device 70 in the width direction X.

The housing unit support member 110 is connected to support walls 14, which are a set of side walls 13 facing each other among a plurality of side walls 13 constituting the chamber 10, via the swing shafts 111, and is supported by the support walls 14.

The housing unit support member 110 swings around the swing shafts 111 as support shafts extending in the length direction Y toward both of the support walls 14 facing each other. That is, a servomotor 120, which is a swinging means for swinging the housing unit 100, is attached to the chamber 10, and the housing unit support member 110 swings by a driving force transmitted from the servomotor 120. When the housing unit support member 110 swings, the housing unit 100 supported by the housing unit support member 110 swings in a direction of an angle θ illustrated in FIG. 2 integrally with the housing unit support member 110 around the swing shafts 111 as the support shafts. Then, the workpiece W housed in the housing unit 100 is stirred inside the housing unit 100 as the housing unit 100 swings. The swing shaft 111 penetrates through the housing unit 100 in the length direction, that is, in a direction parallel to the plasma generation device 40 and the sputtering device 70.

As illustrated in FIG. 1, the pump unit 140 is attached to a bottom portion 15 of the chamber 10, and sucks the fluid in the chamber 10, that is, the gas in the chamber 10 to reduce the pressure in the chamber 10.

The pump unit 140 includes a flow rate adjustment valve 150, which is a valve unit for adjusting the flow rate of the fluid, and a turbo molecular pump 170, which is a pump for sucking the fluid, and the flow rate adjustment valve 150 adjusts the flow rate of the fluid sucked by the turbo molecular pump 170 to reduce the pressure in the chamber 10 to a desired pressure.

The flow rate adjustment valve 150 includes a lifting valve 153 disposed in the chamber 10, and a servo actuator 160 which is a driving means for moving the lifting valve 153 in the vertical direction Z in the chamber 10. The lifting valve 153 moves in the vertical direction Z in the chamber 10 to adjust the flow rate of the fluid sucked by the turbo molecular pump 170. Note that an opening/closing operation of the lifting valve 153 is guided by a valve guide 165.

The flow rate adjustment valve 150 includes a lifting shaft 162 to which the lifting valve 153 is connected, and a worm jack 161 that transmits a driving force generated by the servo actuator 160 to the lifting shaft 162 to move the lifting shaft 162 in the vertical direction Z. A vacuum gauge 180 is attached to the chamber 10, and the pressure in the chamber 10 is detected by the vacuum gauge 180. The servo actuator 160 is operated based on a detection value detected by the vacuum gauge 180, thereby moving the lifting valve 153 in the vertical direction Z based on the detection value detected by the vacuum gauge 180 to adjust the flow rate of the fluid sucked by the turbo molecular pump 170.

Figure 3:
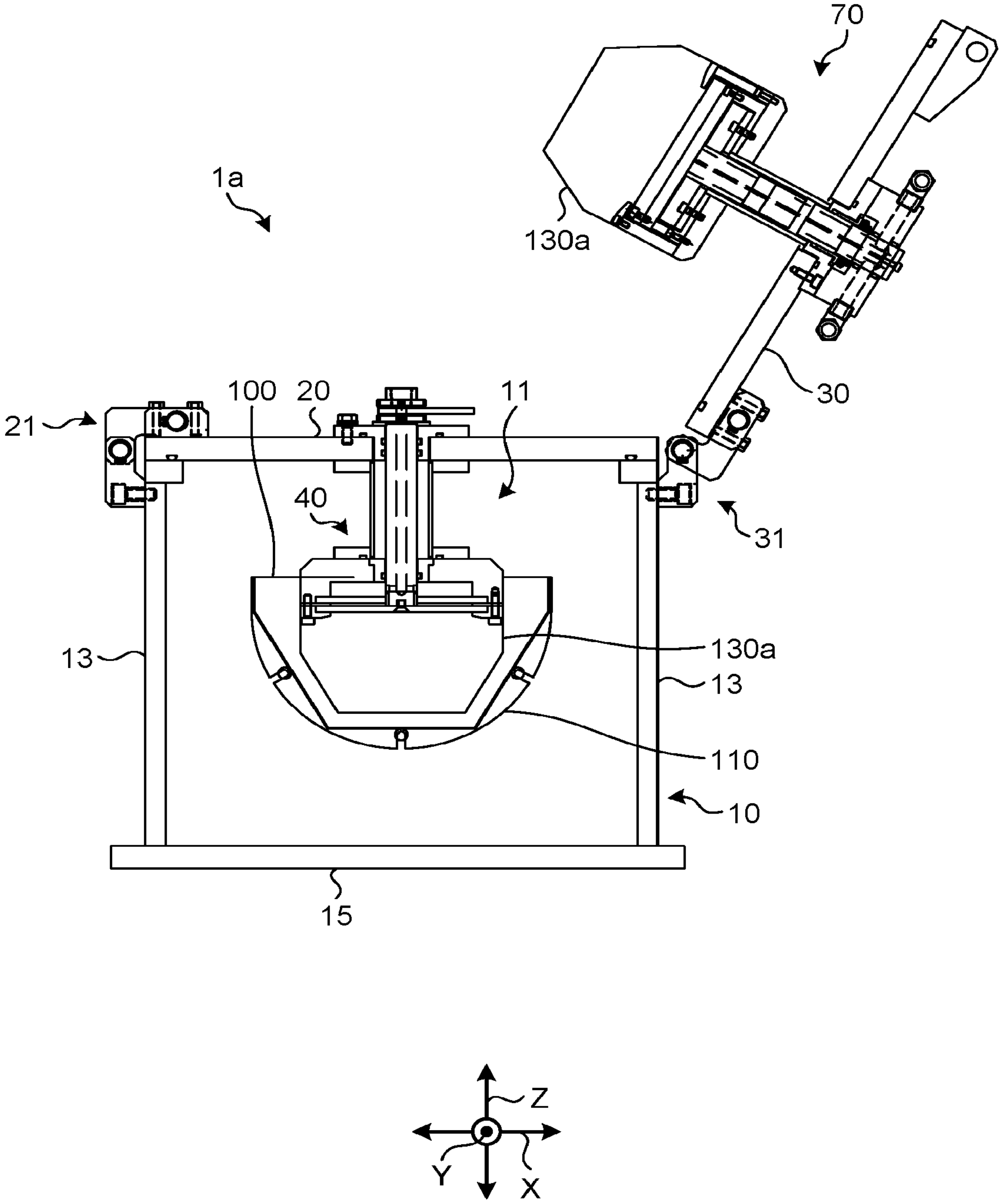
FIG. 3 is a schematic view in a case where a plasma generation device is positioned in a chamber.
Figure 4:
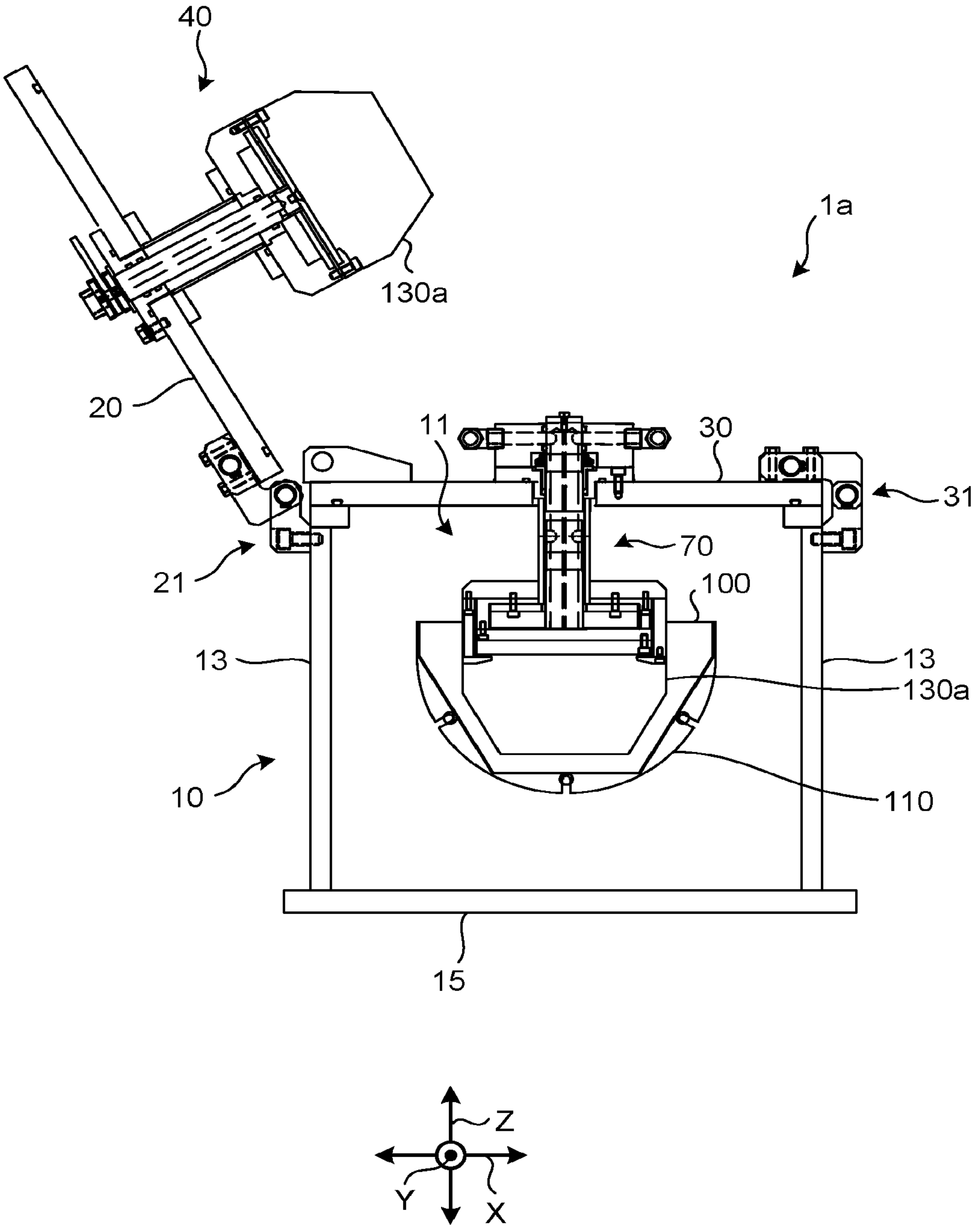
FIG. 4 is a schematic view in a case where a sputtering device is positioned in the chamber.

FIGS. 3 and 4 are schematic views for describing switching between the plasma generation device 40 and the sputtering device 70 to be positioned in the chamber 10. In particular, FIG. 3 is a schematic view in a case where the plasma generation device is positioned in the chamber. FIG. 4 is a schematic view in a case where the sputtering device is positioned in the chamber.

The chamber 10 has an opening 11 formed on an upper side of the chamber 10, and the plasma generation device 40 and the sputtering device 70 are switched to be inserted into the chamber 10 through the opening 11 and be positioned in the chamber 10. Specifically, as illustrated in FIG. 3, the plasma generation device 40 is disposed on a first opening/closing member 20 attached to the chamber 10 in an openable and closable manner at a hinge portion 21. As illustrated in FIG. 4, the sputtering device 70 is disposed on a second opening/closing member 30 attached to the chamber 10 in an openable and closable manner at a hinge portion 31.

Both the first opening/closing member 20 and the second opening/closing member 30 have a substantially rectangular shape in plan view, and have substantially the same shape as an outer peripheral shape formed by the plurality of side walls 13 when the chamber 10 is projected in the vertical direction Z. Therefore, the first opening/closing member 20 and the second opening/closing member 30 have shapes capable of covering the opening 11 of the chamber 10. That is, the first opening/closing member 20 and the second opening/closing member 30 cover the opening 11 of the chamber 10 to close the opening 11. The first opening/closing member 20 and the second opening/closing member 30 are rotatably attached to the chamber 10, such that the first opening/closing member 20 and the second opening/closing member 30 rotate with respect to the chamber 10 to open and close the opening 11.

Specifically, in the first opening/closing member 20, one side of the rectangle and one side wall 13 of the chamber 10 are connected by a hinge portion 21. The hinge portion 21 rotatably connects the first opening/closing member 20 to the chamber 10 so as to be rotatable around a rotating shaft extending in the horizontal direction as a support shaft. The first opening/closing member 20 rotates around the hinge portion 21 so that a position of the first opening/closing member 20 is switched between a position in a state of covering the opening 11 of the chamber 10 and closing the opening 11 and a position in a state of bouncing up above the opening 11 and opening the opening 11. The plasma generation device 40 penetrates through the first opening/closing member 20 in the thickness direction of the first opening/closing member 20 and is attached to the first opening/closing member 20. In addition, the plasma generation device 40 is attached to the first opening/closing member 20 so that a portion for generating plasma in the plasma generation device 40 is positioned in the chamber 10 when the first opening/closing member 20 rotatably connected to the chamber 10 is closed.

In the second opening/closing member 30, one side of the rectangle and the side wall 13 facing the side wall 13 to which the first opening/closing member 20 is connected among the plurality of side walls 13 of the chamber 10 are connected by a hinge portion 31. The hinge portion 31 rotatably connects the second opening/closing member 30 to the chamber 10 so as to be rotatable around a rotating shaft extending in the horizontal direction as a support shaft. The second opening/closing member 30 rotates around the hinge portion 31 so that a position of the second opening/closing member 30 is switched between a position in a state of covering the opening 11 of the chamber 10 and closing the opening 11 and a position in a state of bouncing up above the opening 11 and opening the opening 11. The sputtering device 70 penetrates through the second opening/closing member 30 in the thickness direction of the second opening/closing member 30 and is attached to the second opening/closing member 30. In addition, the sputtering device 70 is attached to the second opening/closing member 30 so that a portion for performing sputtering in the sputtering device 70 is positioned in the chamber 10 when the second opening/closing member 30 rotatably connected to the chamber 10 is closed.

When the opening 11 of the chamber 10 is closed, one of the first opening/closing member 20 and the second opening/closing member 30 is closed and the other is opened. That is, the first opening/closing member 20 or the second opening/closing member 30 closes the opening 11 of the chamber 10 in a state in which the other does not close the opening 11. Therefore, the first opening/closing member 20 closes the opening 11 in a state in which the second opening/closing member 30 does not close the opening 11, such that the portion for generating plasma in the plasma generation device 40 is positioned in the chamber 10 (see FIG. 3). Similarly, the second opening/closing member 30 closes the opening 11 in a state in which the first opening/closing member 20 does not close the opening 11, such that the portion for performing sputtering in the sputtering device 70 is positioned in the chamber 10 (see FIG. 4).

1-2. Description of Plasma Generation Device

Figure 5:
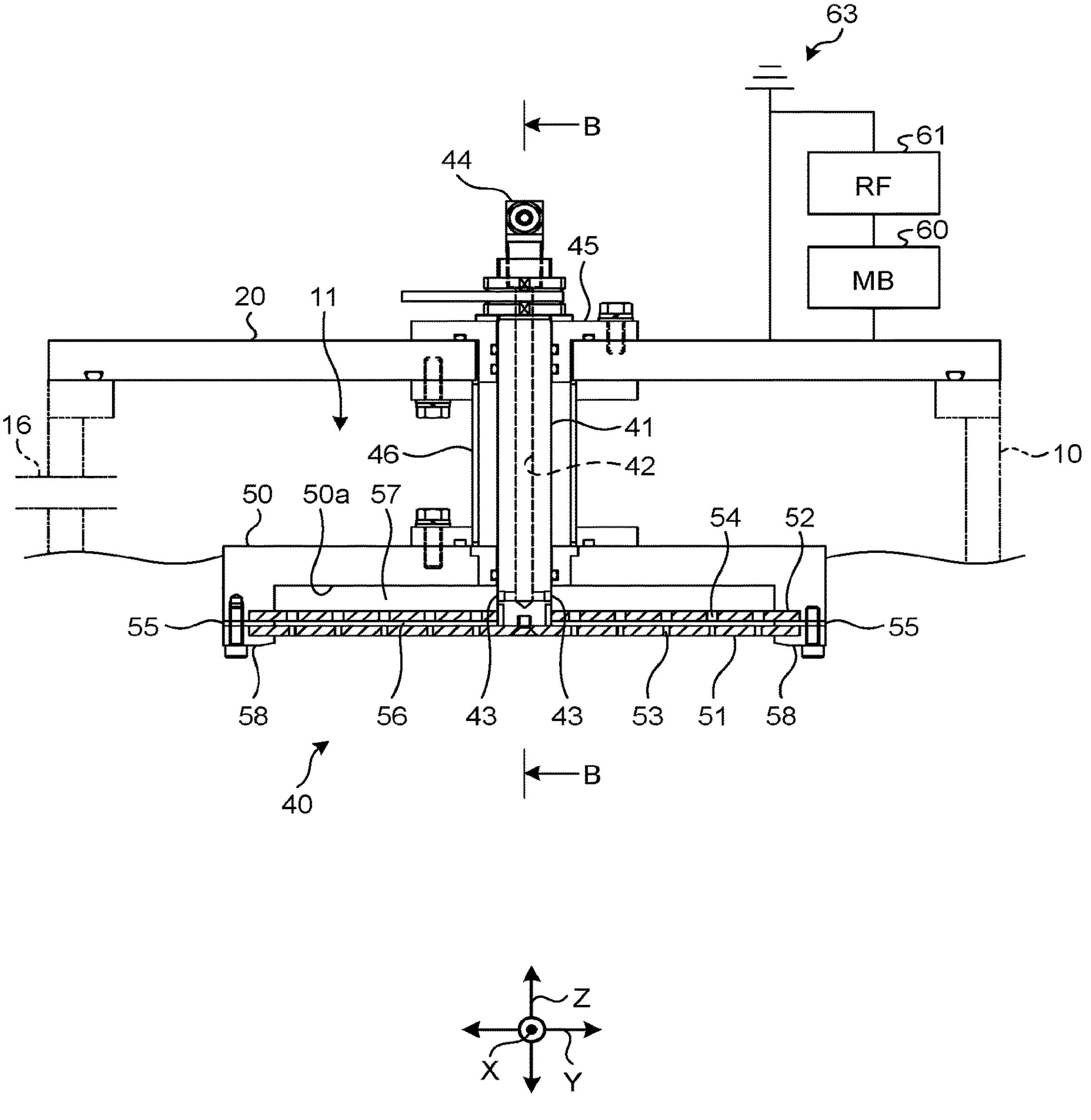
FIG. 5 is a detailed view of the plasma generation device.
Figure 6:
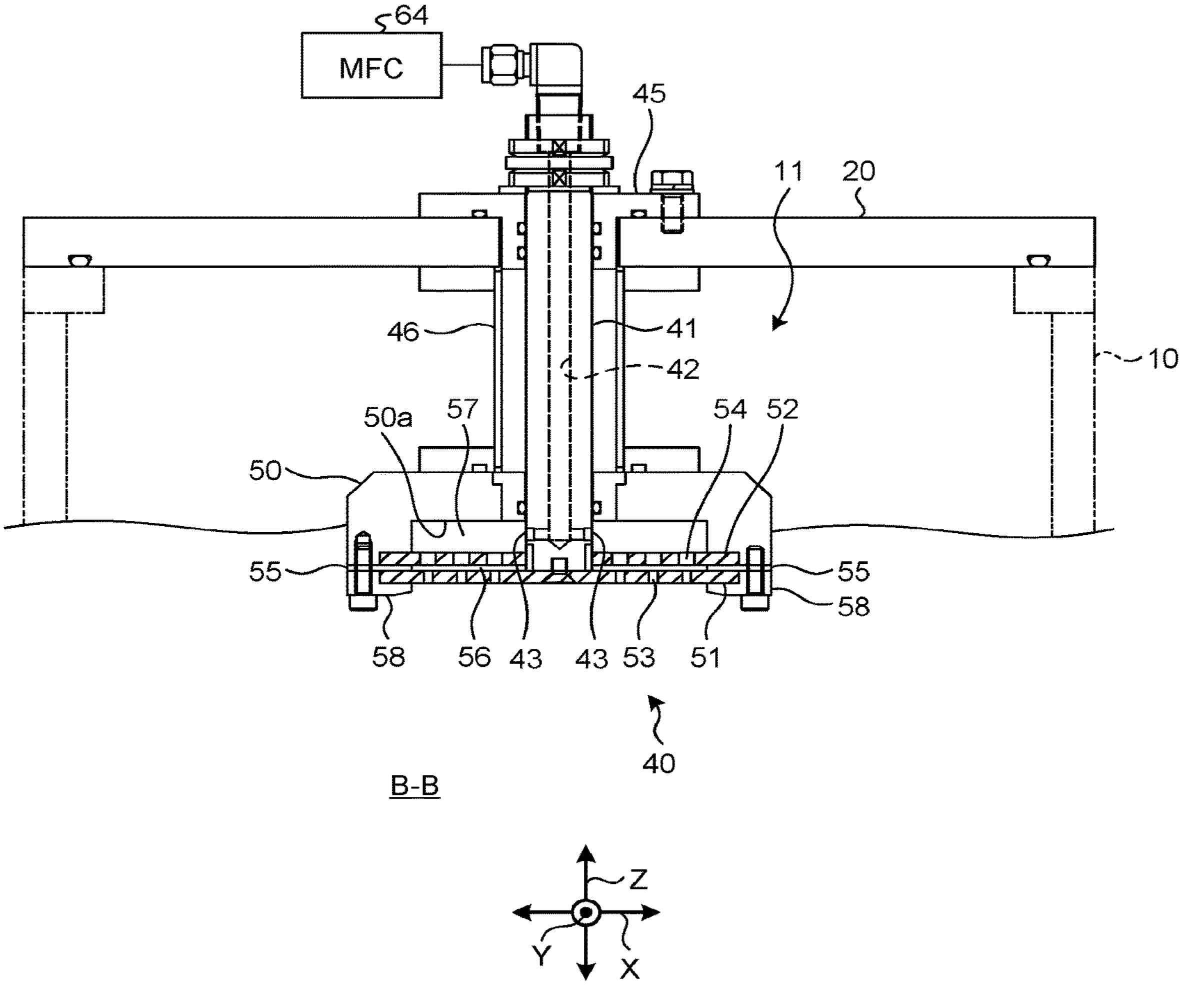
FIG. 6 is a cross-sectional view taken along line B-B of FIG. 5.

FIG. 5 is a detailed view of the plasma generation device. FIG. 6 is a cross-sectional view taken along line B-B of FIG.

5. The plasma generation device 40 includes a gas supply pipe 41 that supplies gas used when generating plasma, and a pair of plate-shaped conductor portions 51 and 52 that generate plasma from the gas supplied from the gas supply pipe 41 by a high-frequency voltage.

Specifically, the gas supply pipe 41 penetrates through the first opening/closing member 20 in the thickness direction of the first opening/closing member 20, and is attached to the first opening/closing member 20 by a gas supply pipe attachment member 45. A gas flow path 42 extending in an extending direction of the gas supply pipe 41 is formed inside the gas supply pipe 41, and the gas is supplied from the outside of the chamber 10 into the chamber 10 through the gas flow path 42. Note that a gas supply portion 44 that supplies gas to the gas supply pipe 41 is connected to an end portion of the gas supply pipe 41 on the outside of the first opening/closing member 20 (the outside of the chamber 10), and a gas supply hole 43 that is a hole for introducing the gas flowing through the gas flow path 42 into the chamber 10 is formed at the other end portion of the gas supply pipe 41 (the inside of the chamber 10). The gas is supplied to the gas supply portion 44 via a mass flow controller (MFC) 64 (see FIG. 6) in which a mass flowmeter has a flow rate control function.

Each of the pair of plate-shaped conductor portions 51 and 52 is formed in a flat plate shape, and is formed by arranging a metal plate such as aluminum or another conductor plate in parallel. Note that the plate-shaped conductor portions 51 and 52 may have a dielectric film on surfaces thereof, may have a configuration in which the surfaces of the pair of plate-shaped conductor portions 51 and 52 on a side where plasma gas is led out may be covered with the dielectric film by alumina spraying or hard anodizing in order to avoid arc discharge or the like, or may have a configuration in which both surfaces of each of the plate-shaped conductor portions 51 and 52 are subjected to alumina spraying or hard anodizing. Note that the pair of plate-shaped conductor portions 51 and 52 form electrodes of the plasma generation device 40.

The pair of plate-shaped conductor portions 51 and 52 are supported by a support plate 50. The support plate 50 is formed of, for example, an insulating material such as glass or ceramic. The support plate 50 is formed in a shape in which a protruding portion is formed over the entire periphery near the outer periphery on one surface side of the plate. In other words, the support plate 50 is formed in a thick plate-like shape in which a recess portion 50*a* recessed along the outer periphery of the support plate 50 is formed on one surface side.

The support plate 50 formed in this manner is supported by a support member 46 so that a surface on a side where the recess portion 50*a* is not formed faces the first opening/closing member 20, and a surface on a side where the recess portion 50*a* is formed is positioned on a side opposite to a side where the first opening/closing member 20 is positioned. The support member 46 includes a cylindrical member and attachment members positioned at both ends of the cylindrical member. The attachment member on one end side is attached to the first opening/closing member 20, and the attachment member on the other end side is attached to the support plate 50. Therefore, the support plate 50 is supported by the support member 46 disposed between and attached to the support plate 50 and the first opening/closing member 20.

The gas supply pipe 41 penetrating through the first opening/closing member 20 passes through the inside of the cylindrical member in the support member 46, extends toward the support plate 50, and penetrates through the support plate 50. Further, the gas supply hole 43 formed in the gas supply pipe 41 is disposed in a portion where the recess portion 50*a* is formed in the support plate 50.

The pair of plate-shaped conductor portions 51 and 52 are disposed on the side of the support plate 50 where the recess portion 50*a* is formed so as to cover the recess portion 50*a*. At this time, a spacer 55 is disposed in the vicinity of the outer periphery between the pair of plate-shaped conductor portions 51 and 52, and the pair of plate-shaped conductor portions 51 and 52 overlap each other with the spacer 55 interposed therebetween. As described above, in the pair of plate-shaped conductor portions 51 and 52 overlapping each other with the spacer 55 interposed therebetween, the plate-shaped conductor portion 51 and the plate-shaped conductor portion 52 are separated from each other at a portion other than a portion where the spacer 55 is disposed, and the portion is a gap portion 56. An interval between the pair of plate-shaped conductor portions 51 and 52 is preferably appropriately set according to gas to be introduced into the plasma generation device 40, a frequency of power to be supplied, the size of an electrode, and the like, and is, for example, about 3 mm to 12 mm.

The pair of plate-shaped conductor portions 51 and 52 are held by holding members 58, which are members for holding the plate-shaped conductor portions 51 and 52 in a state where the plate-shaped conductor portions 51 and 52 overlap each other with the spacer 55 interposed therebetween. That is, the holding members 58 are disposed on a side of the plate-shaped conductor portions 51 and 52 that is opposite to a side where the support plate 50 is positioned, and are attached to the support plate 50 in a state in which the plate-shaped conductor portions 51 and 52 are sandwiched between the holding members 58 and the support plate 50. As a result, the pair of plate-shaped conductor portions 51 and 52 overlapping each other with the spacer 55 interposed therebetween are held by the holding members 58 in a state of being sandwiched between the holding members 58 and the support plate 50.

The pair of plate-shaped conductor portions 51 and 52 are disposed so as to cover the recess portion 50*a* in the support plate 50, and in a state in which the pair of plate-shaped conductor portions 51 and 52 are held by the holding members 58, a space is formed between the recess portion 50*a* of the support plate 50 and the plate-shaped conductor portions 51 and 52.

In a case where the plate-shaped conductor portion 52 is disposed on the support plate 50 side and the plate-shaped conductor portion 51 is disposed on the holding member 58 side among the pair of plate-shaped conductor portions 51 and 52 disposed in an overlapping manner, this space is defined by the recess portion 50*a* of the support plate 50 and the plate-shaped conductor portion 52. The space thus formed is formed as a gas introduction portion 57 into which the gas supplied by the gas supply pipe 41 is introduced. The gas supply hole 43 of the gas supply pipe 41 is positioned in the gas introduction portion 57 and opened to the gas introduction portion 57. The gas introduction portion 57 is defined by closely attaching the support plate 50 and the plate-shaped conductor portion 52.

A large number of through holes 53 and 54 penetrating in the thickness direction are formed in the pair of plate-shaped conductor portions 51 and 52, respectively. That is, in the plate-shaped conductor portion 52 positioned on a side where the gas supplied by the gas supply pipe 41 flows in, a plurality of through holes 54 are formed at predetermined intervals in a matrix form when viewed in the thickness direction of the plate-shaped conductor portion 52, and in the plate-shaped conductor portion 51 positioned on a side where the gas supplied by the gas supply pipe 41 flows out, a plurality of through holes 53 are formed at predetermined intervals in a matrix form when viewed in the thickness direction of the plate-shaped conductor portion 51.

The through hole 53 of the plate-shaped conductor portion 51 and the through hole 54 of the plate-shaped conductor portion 52 are cylindrical holes, and both the through holes 53 and 54 are coaxially disposed. That is, the through hole 53 of the plate-shaped conductor portion 51 and the through hole 54 of the plate-shaped conductor portion 52 are disposed at positions where the centers of the respective through holes are aligned. The through hole 53 of the plate-shaped conductor portion 51 is smaller in diameter than the through hole 54 of the plate-shaped conductor portion 52 on the gas inflow side. As described above, the plurality of through holes 53 and 54 are formed in the pair of plate-shaped conductor portions 51 and 52 to form a hollow electrode structure, and the generated plasma gas flows through the plurality of through holes 53 and 54 at high density.

The gap portion 56 is interposed between the parallel plate type plate-shaped conductor portions 51 and 52, and the gap portion 56 functions as a capacitor having a capacitance. Further, a conductive portion (not illustrated) is formed of a conductive member on the support plate 50 and the plate-shaped conductor portions 51 and 52, the support plate 50 is connected to a ground 63 by the conductive portion, and the plate-shaped conductor portion 52 is also connected to the ground 63. In addition, one end portion of a radio frequency power supply (RF) 61 is connected to the ground 63, and the other end portion of the radio frequency power supply 61 is electrically connected to the plate-shaped conductor portion 51 via a matching box (MB) 60 for adjusting a capacitance and the like to achieve matching with plasma. Therefore, in a case where the radio frequency power supply 61 is operated, a potential of the plate-shaped conductor portion 51 swings between positive and negative at a predetermined frequency such as 13.56 MHz.

1-3. Description of Sputtering Device

Figure 7:
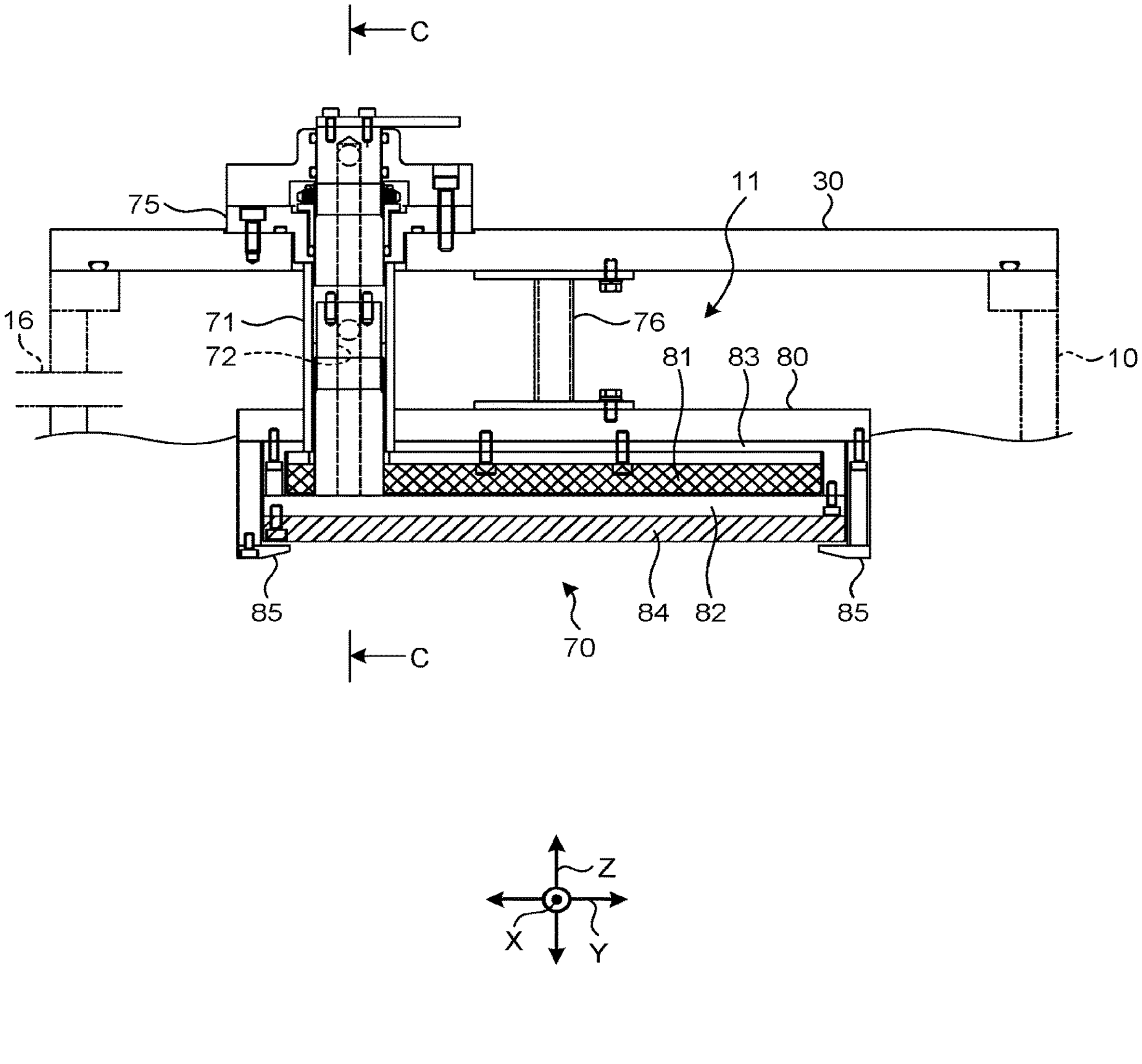
FIG. 7 is a detailed view of the sputtering device.
Figure 8:
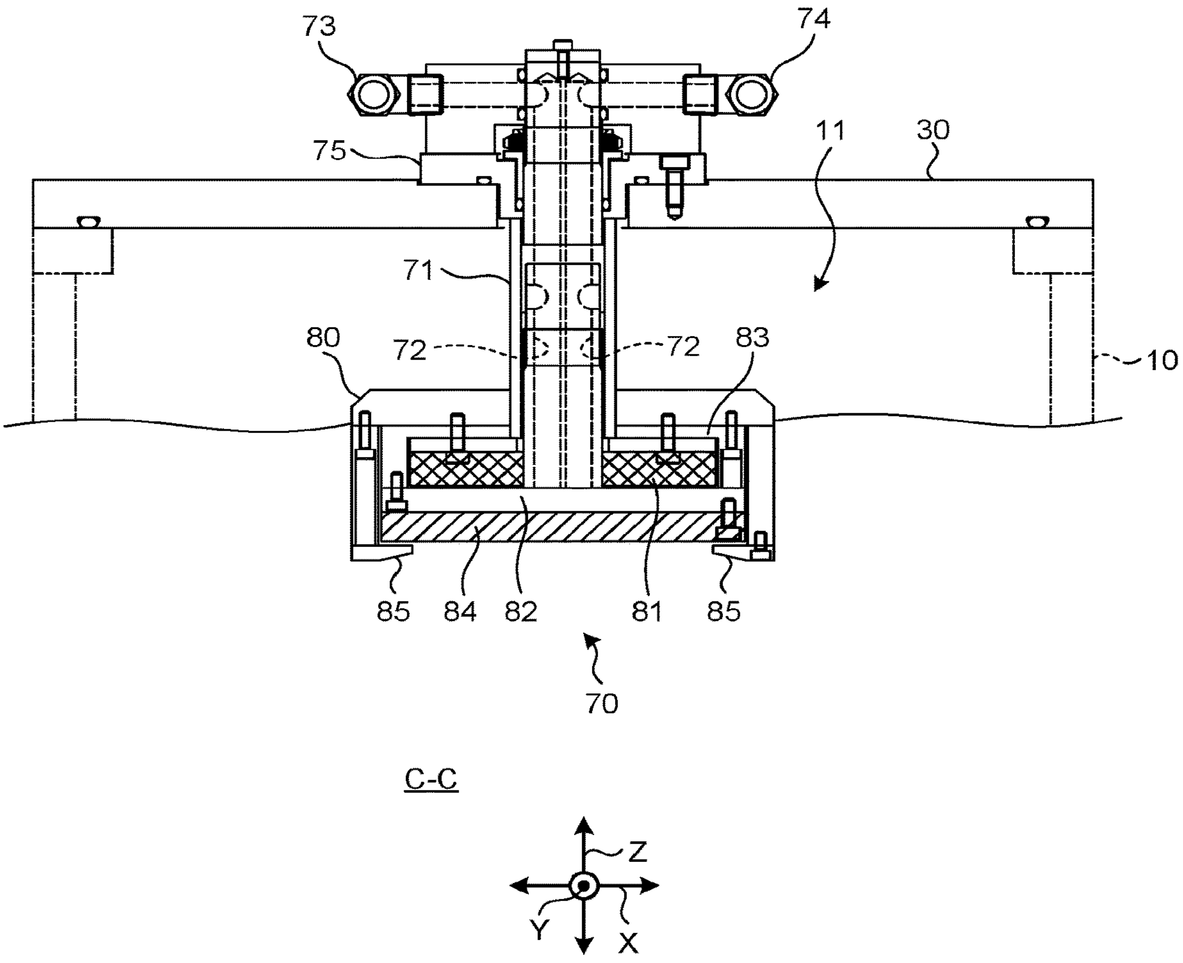
FIG. 8 is a cross-sectional view taken along line C-C of FIG. 7.

FIG. 7 is a detailed view of the sputtering device. FIG. 8 is a cross-sectional view taken along line C-C of FIG. 7. The sputtering device 70 includes a cooling water pipe 71 through which cooling water flows, a magnet 81 that generates a magnetic field, a target 84 that ejects atoms used for film formation by ionizing and colliding inert gas (for example, argon) flowing in from the gas inflow portion 16 inside the magnetic field generated by the magnet 81, a cooling jacket 82 that cools the target 84, and a support plate 80 that supports the magnet 81, the target 84, and the cooling jacket 82. Specifically, the cooling water pipe 71 penetrates through the second opening/closing member 30 in the thickness direction of the second opening/closing member 30, and is attached to the second opening/closing member 30 by a cooling water pipe attachment member 75. Note that the target 84 is, for example, a copper plate, and copper atoms ejected from the target 84 closely adhere to the surface of the workpiece W to form a thin film on the surface of the workpiece W. The thin film thus formed serves as a base for performing plating on the surface of the workpiece W in the subsequent step.

In addition, cooling water paths 72 extending in an extending direction of the cooling water pipe 71 are formed inside the cooling water pipe 71, and the cooling water is circulated between the outside of the chamber 10 and the cooling jacket 82 disposed in the chamber 10. As illustrated in FIG. 8, an end portion of the cooling water pipe 71 on the outside of the second opening/closing member 30 (the outside of the chamber 10) is connected to a water inlet 73 which is an inlet of the cooling water and a water outlet 74 which is an outlet of the cooling water. Therefore, as the cooling water paths 72 formed inside the cooling water pipe 71, a cooling water path 72 connected to the water inlet 73 and a cooling water path 72 connected to the water outlet 74 are formed. On the other hand, an end portion of the cooling water pipe 71 on the other end side (the inside of the chamber 10) is connected to the cooling jacket 82. A cooling water flow path is formed inside the cooling jacket 82, and the cooling water flows. As a result, the cooling water is circulated between the outside of the chamber 10 and the cooling jacket 82.

The support plate 80 supports the magnet 81, the cooling jacket 82, and the target 84 in an overlapping state. Specifically, the support plate 80, the magnet 81, the cooling jacket 82, and the target 84 are all formed in a plate shape, and the support plate 80 is formed so as to be larger in plan view than the magnet 81, the cooling jacket 82, and the target 84. Therefore, the magnet 81, the cooling jacket 82, and the target 84 are held by the support plate 80 and a holding member 85 in a manner in which a portion in the vicinity of an outer periphery of a surface of the target 84 that is opposite to a surface facing the cooling jacket 82 is supported by the holding member 85 in a state in which the magnet 81, the cooling jacket 82, and the target 84 overlap one another in this order from the support plate 80 side. The magnet 81, the cooling jacket 82, and the target 84 held by the holding member 85 are also held in a state in which outer peripheral portions thereof are surrounded by the holding member 85.

At this time, an insulating material 83 is disposed between the support plate 80 and the magnet 81, and the insulating material 83 is also disposed on the outer peripheral portion of the magnet 81 in plan view. That is, the insulating material 83 is disposed between the support plate 80 and the magnet 81 and between the magnet 81 and the holding member 85. Therefore, the magnet 81 is held by the support plate 80 and the holding member 85 via the insulating material 83.

A surface of the support plate 80 on a side where the magnet 81 and the like are held is positioned on a side opposite to a side where the second opening/closing member 30 is positioned, and a surface on a side opposite to the side where the magnet 81 and the like are held is disposed so as to face the second opening/closing member 30, and is supported by a support member 76. The support member 76 includes a cylindrical member and attachment members positioned at both ends of the cylindrical member. The attachment member on one end side is attached to the second opening/closing member 30, and the attachment member on the other end side is attached to the support plate 80. At this time, the support plate 80 is attached at a position near a central portion when the support plate 80 is viewed in the thickness direction. Therefore, the support plate 80 is supported by the support member 76 disposed between and attached to the support plate 80 and the second opening/closing member 30.

Note that the cooling water pipe 71 having one end connected to the cooling jacket 82 penetrates through the support plate 80, the magnet 81, and the insulating material 83 from the side of the support plate 80 that is opposite to the surface on the side where the magnet 81 and the like are held, at a position different from a position where the support member 76 is disposed. Accordingly, the cooling water pipe 71 is connected to the cooling jacket 82.

1-4. Description of Configuration Around Housing Unit

Figure 9:
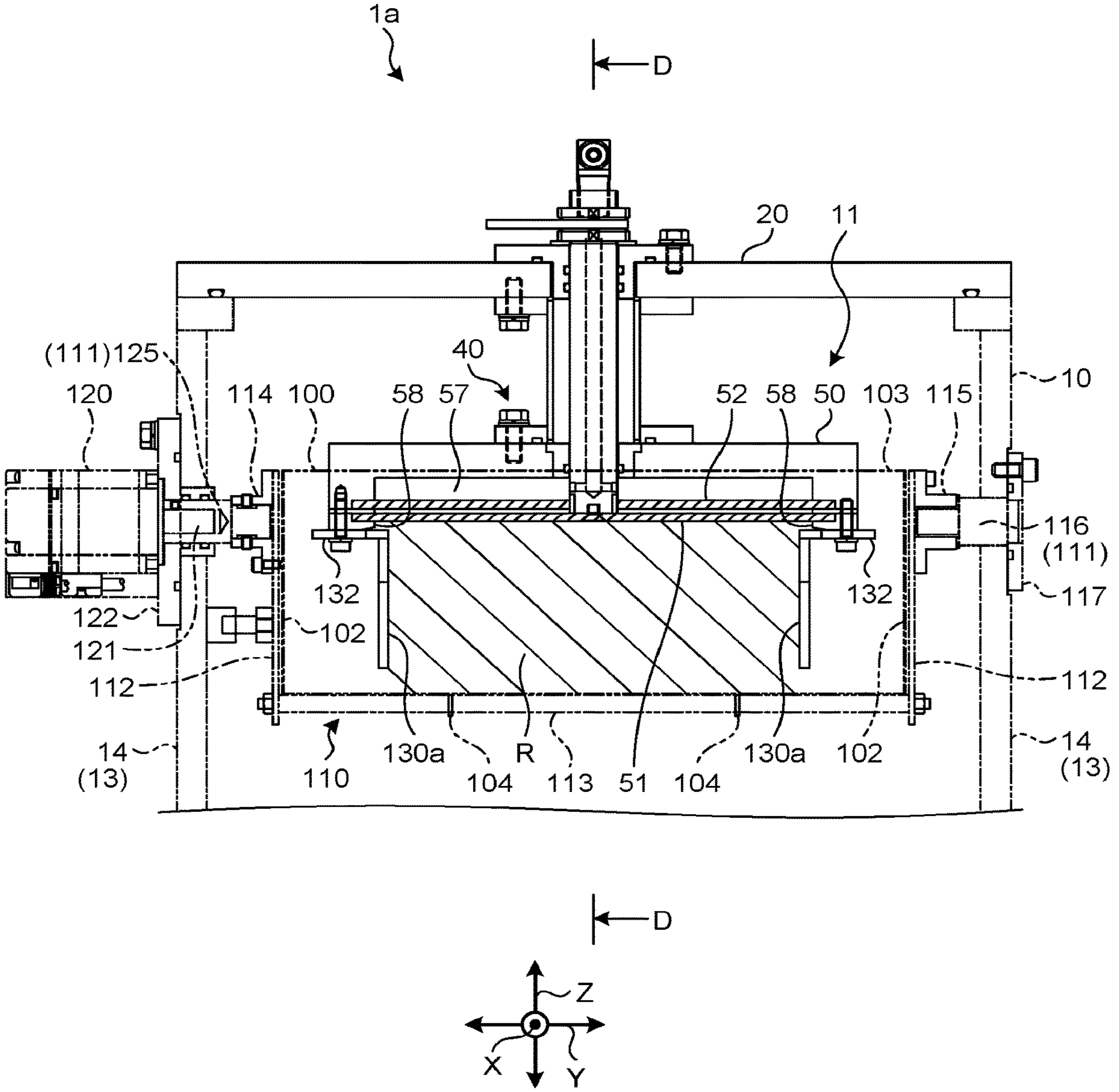
FIG. 9 is an explanatory diagram illustrating a configuration around a housing unit when the plasma generation device is positioned in the chamber.
Figure 10:
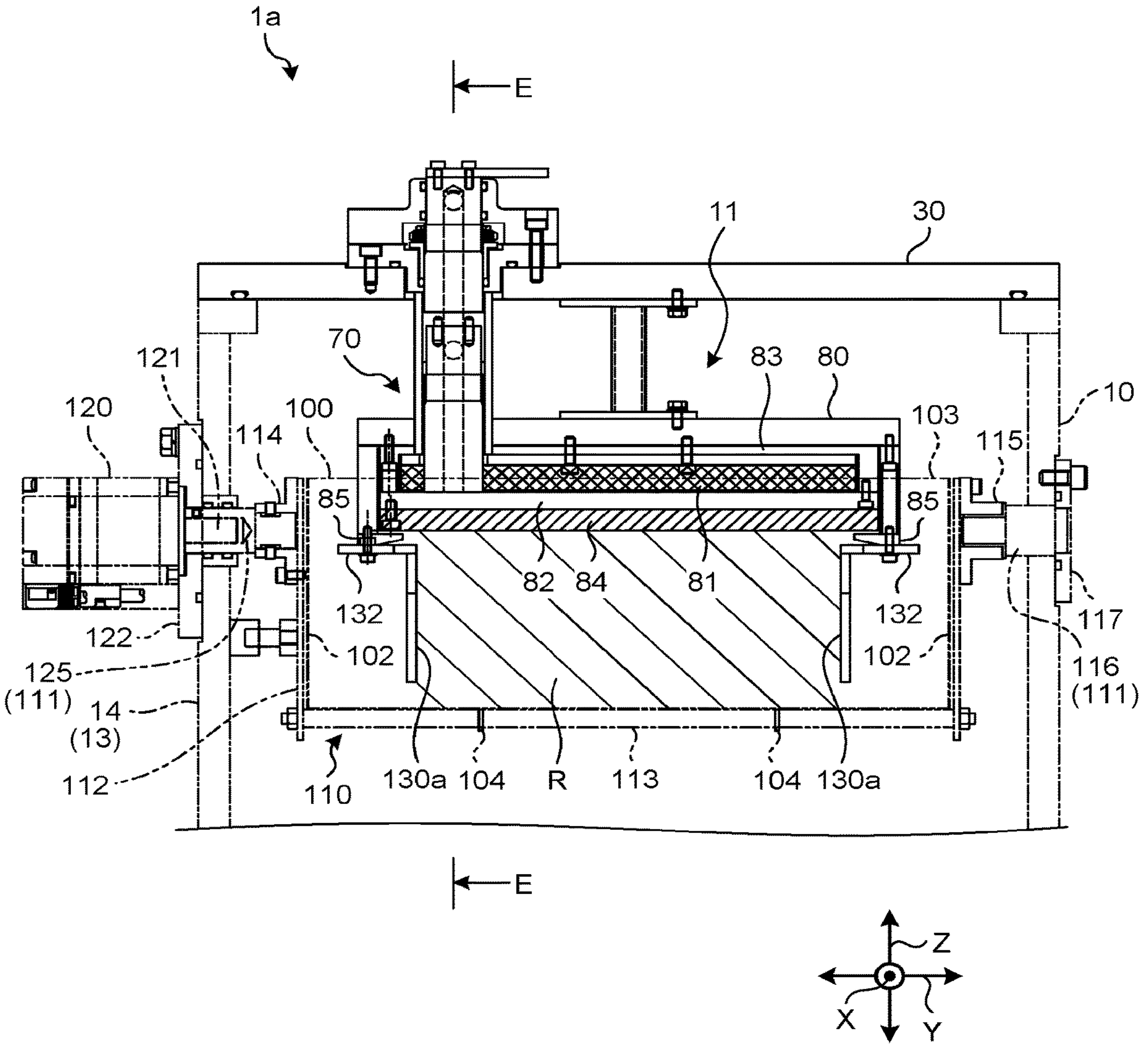
FIG. 10 is an explanatory diagram illustrating a configuration around the housing unit when the sputtering device is positioned in the chamber.
Figure 11:
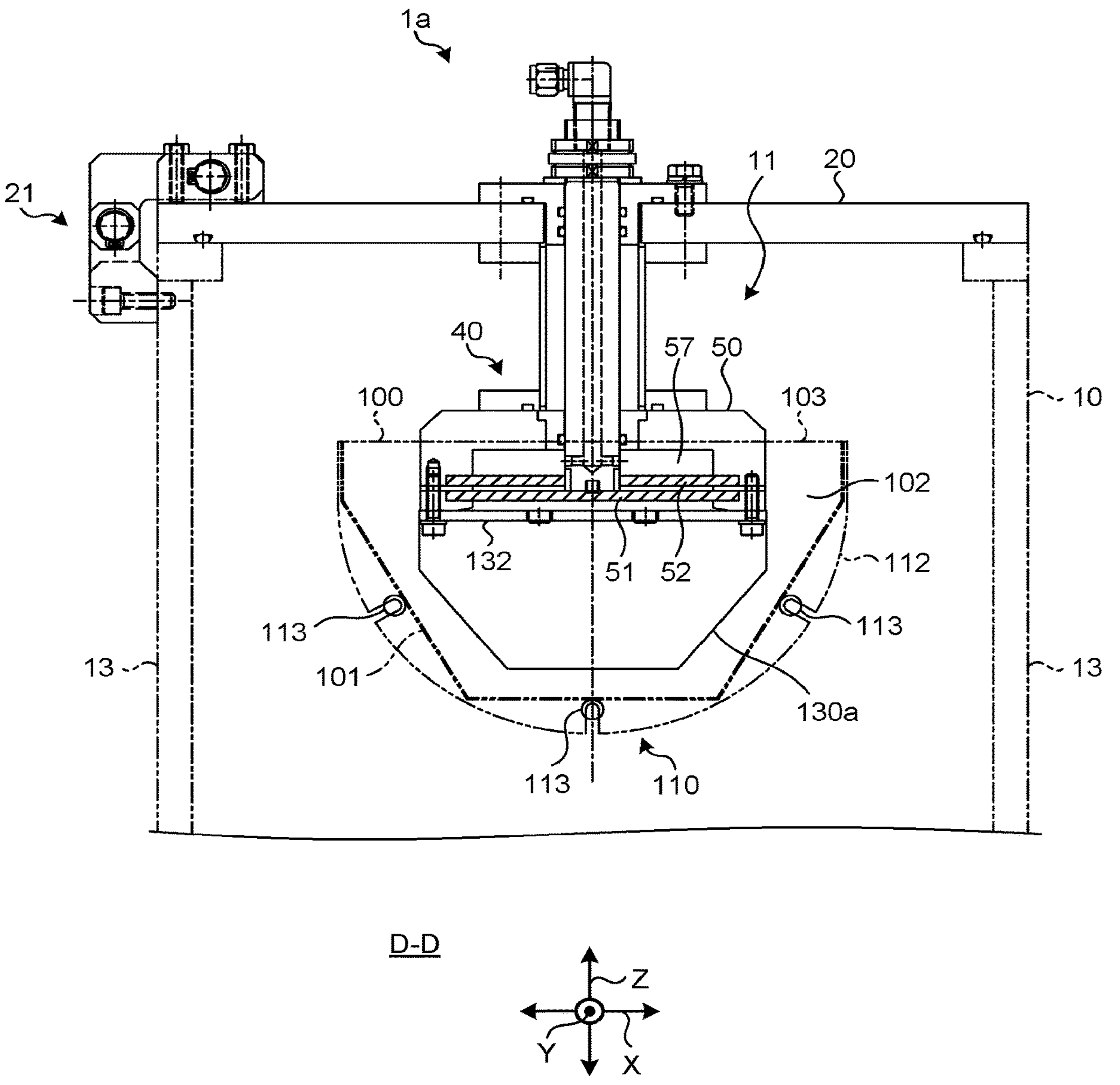
FIG. 11 is a cross-sectional view taken along line D-D of FIG. 9.
Figure 12:
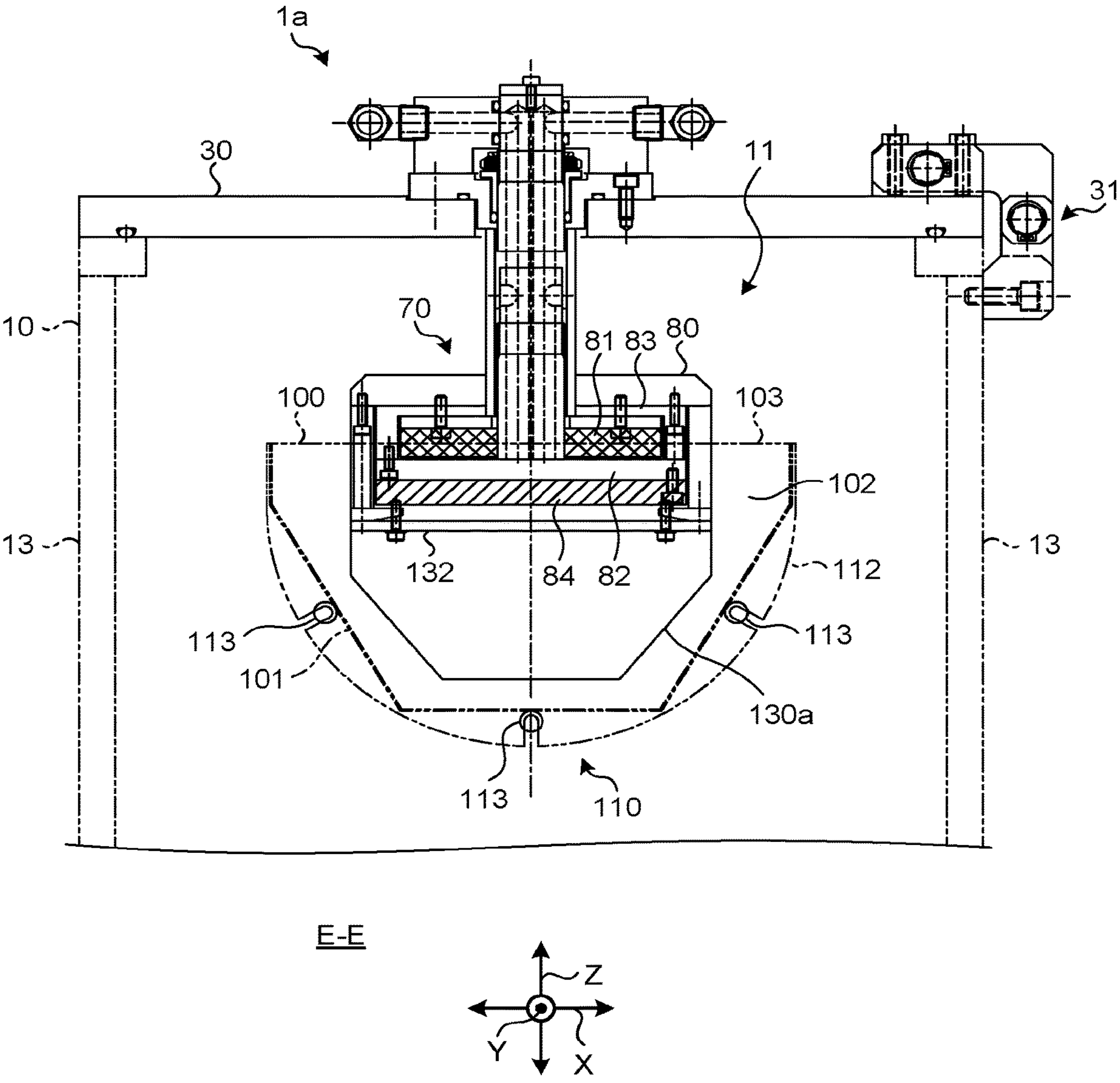
FIG. 12 is a cross-sectional view taken along line E-E of FIG. 10.

FIGS. 9 and 10 are explanatory diagrams illustrating the housing unit 100, the housing unit support member 110, and the correction plate 130*a* illustrated in FIG. 1, and in particular, FIG. 9 is an explanatory diagram illustrating a configuration around the housing unit when the plasma generation device is positioned in the chamber. FIG. 10 is an explanatory diagram illustrating a configuration around the housing unit when the sputtering device is positioned in the chamber. FIG. 11 is a cross-sectional view taken along line D-D of FIG. 9. FIG. 12 is a cross-sectional view taken along line E-E of FIG. 10.

As illustrated in FIG. 9, the electrodes (the pair of plate-shaped conductor portions 51 and 52) of the plasma generation device 40 are independently positioned outside a housing space R in which the workpiece W is housed in the housing unit 100. More specifically, the housing space R of the housing unit 100 is positioned below the plasma generation device 40. As illustrated in FIG. 10, the magnet 81 and the target 84 of the sputtering device 70 are independently positioned outside the housing space R of the housing unit 100. More specifically, the housing space R of the housing unit 100 is positioned below the sputtering device 70.

The housing unit support member 110 is supported in a manner in which the swing shafts 111 are connected to the support walls 14, which are a set of side walls 13 facing each other, among the plurality of side walls 13 of the chamber 10, and the housing unit support member 110 swings by a driving force transmitted from the servomotor 120, which is the swinging means. Specifically, the housing unit support member 110 includes a pair of side plates 112 spaced apart from each other in the length direction Y inside the chamber 10 and disposed parallel to the support walls 14, and an attachment member 113 extending in the length direction Y and disposed between the pair of side plates 112. Each of the side plates 112 is formed in a substantially semicircular plate shape as illustrated in FIG. 11, and is disposed so that a flat portion of the semicircle is positioned near the opening 11 of the chamber 10 and an arcuate portion of the semicircle is positioned near the bottom portion 15 of the chamber 10 (see FIGS. 3 and 4).

In addition, an interval between the side plates 112 in the length direction Y is larger than the sizes of the plasma generation device 40 and the sputtering device 70 in the length direction Y in a state in which the plasma generation device 40 or the sputtering device 70 is positioned in the chamber 10. Further, an upper end of the side plate 112 in the vertical direction Z in the chamber 10 is disposed so as to be positioned above a lower end of the plasma generation device 40 or the sputtering device 70 in the vertical direction Z in a state in which the plasma generation device 40 or the sputtering device 70 is positioned in the chamber 10.

The length of the flat portion of the semicircle of the side plate 112 is larger than the width of the plasma generation device 40 or the sputtering device 70 in the width direction X. In other words, the entire width of the side plate 112 in the width direction X is larger than the entire width of the plasma generation device 40 or the sputtering device 70 in the width direction X in a range in which the position of the side plate 112 in the vertical direction Z overlaps the plasma generation device 40 or the sputtering device 70. In addition, since the side plate 112 is formed in a substantially semicircular shape and is disposed so that the arcuate portion is positioned near the bottom portion 15 of the chamber 10 (see FIGS. 3 and 4), the width of the side plate 112 in the width direction X decreases from the upper side toward the lower side.

The swing shaft 111 is provided for each of the pair of side plates 112 so that a shaft center is parallel to the length direction Y, and different swing shafts 111 are connected to the side plates 112. Among the swing shafts 111, a drive shaft 125 that is connected to an output shaft 121 of the servomotor 120 and rotates integrally with the output shaft 121 is used as the swing shaft 111 on a side where the servomotor 120 for swinging the housing unit 100 is positioned. That is, the servomotor 120 is attached to one support wall 14 in the set of support walls 14. The servomotor 120 is attached to an outer surface of the chamber 10 on the support wall 14 by a servomotor attachment member 122, and the output shaft 121 that outputs the driving force generated by the servomotor 120 penetrates through the support wall 14 and extends from the support wall 14 into the chamber 10. The drive shaft 125 is disposed in the chamber 10, and is connected to the output shaft 121 in a state in which relative rotation with respect to the output shaft 121 of the servomotor 120 is not allowed in the chamber 10, that is, in a state in which the drive shaft 125 is integrally rotatable with respect to the output shaft 121. Further, an end portion of the drive shaft 125 that is opposite to an end portion on a side connected to the output shaft 121 of the servomotor 120 is connected to the side plate 112 by a swinging means shaft connection portion 114. As a result, the drive shaft 125 is used as the swing shaft 111, and the driving force generated by the servomotor 120 is transmitted from the output shaft 121 of the servomotor 120 to the drive shaft 125, and is transmitted from the drive shaft 125 to the side plate 112 of the housing unit support member 110.

Among the swing shafts 111, a support shaft 116 is used as the swing shaft 111 positioned on a side opposite to the side where the servomotor 120 is positioned. One end of the support shaft 116 is supported by a support shaft support member 117, and the other end of the support shaft 116 is connected to the side plate 112 by a support shaft connection portion 115.

More specifically, a portion in the vicinity of an end portion of the support shaft 116 on a side supported by the support shaft support member 117 penetrates through the support wall 14 and is supported in a non-rotatable state by the support shaft support member 117 from the outer surface of the chamber 10 on the support wall 14. A portion in the vicinity of an end portion of the support shaft 116 on a side connected to the support shaft connection portion 115 is rotatably supported by the support shaft connection portion 115 attached to the side plate 112. That is, the support shaft connection portion 115 and the support shaft 116 are relatively rotatable around a shaft center of the support shaft 116.

The side plate 112 on the side connected to the drive shaft 125 and the side plate 112 on the side connected to the support shaft 116 are connected by the attachment member 113 disposed between the side plates 112. The attachment member 113 is formed of a rod-like member extending in the length direction Y, and both ends thereof are attached to different side plates 112. A plurality of attachment members 113 are disposed near an outer periphery of the arcuate portion of the side plate 112 formed in a substantially semicircular shape as illustrated in FIGS. 11 and 12. Thus, the pair of side plates 112 are connected to each other by the plurality of attachment members 113. Therefore, when the side plate 112 on the side connected to the drive shaft 125 swings by the driving force transmitted from the servomotor 120, a force in a swing direction is also transmitted to the other side plate 112, and the pair of side plates 112 swing integrally.

Figure 13:
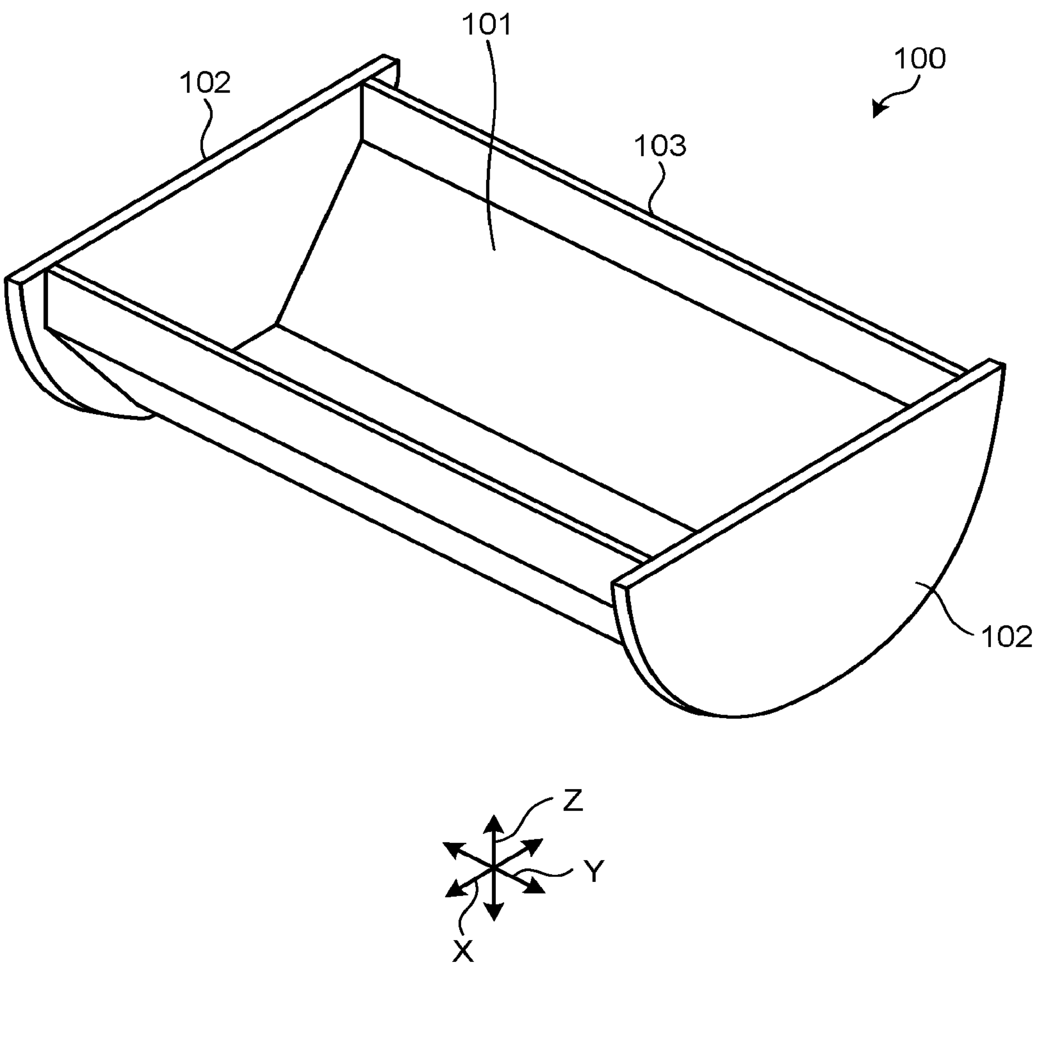
FIG. 13 is a perspective view of the housing unit.

The housing unit support member 110 formed in this manner supports the housing unit 100. FIG. 13 is a perspective view of the housing unit. The housing unit 100 is formed in a basket shape by a workpiece holding wall 101 and side walls 102. Among them, the side wall 102 is formed of a plate-like member disposed parallel to the side plate 112 in the vicinity of the side plate 112 of the housing unit support member 110 in a state in which the housing unit 100 is supported by the housing unit support member 110, and a pair of the side walls 102 are disposed similarly to the side plates 112. An interval between the pair of side walls 102 is slightly smaller than the interval between the pair of side plates 112.

Further, in a state of being supported by the housing unit support member 110, the width of the side wall 102 in the width direction X decreases from the opening 11 side of the chamber 10 toward the bottom portion 15 side of the chamber 10 (see FIGS. 3 and 4), similarly to the side plate 112 of the housing unit support member 110. In the present embodiment, the side wall 102 is formed in a substantially trapezoidal shape, and is disposed so that the longer one of an upper base and a lower base of the trapezoidal shape is positioned on the upper side while being supported by the housing unit support member 110, and the shorter one is positioned on the lower side. As a result, the width of the side wall 102 in the width direction X decreases from the upper side toward the lower side.

Further, in the side wall 102, the longer one of the upper base and the lower base of the trapezoidal shape that is positioned on the upper side extends upward. That is, the side wall 102 is formed in a substantially pentagonal shape in which a rectangle having the same length is added to the longer one of the upper base and the lower base of the trapezoidal shape, when viewed in the length direction Y. As a result, the width of the side wall 102 in the width direction X decreases from the upper side toward the lower side.

The workpiece holding wall 101 is disposed between the pair of side walls 102, and is formed along a side other than an upper side of the pentagonal shape on an outer periphery of the side wall 102. As a result, in the housing unit 100, only a portion on the opening 11 side of the chamber 10 in a state of being supported by the housing unit support member 110 is opened, and this portion is an opening 103 of the housing unit 100. As the opening 103 is formed in this manner, the housing unit 100 is formed in a basket shape, and the workpiece W to be housed in the housing unit 100 can be taken in and out through the opening 103. In addition, the opening 103 of the housing unit 100 has a size that allows the support plate 50 of the plasma generation device 40 or the support plate 80 of the sputtering device 70 to be inserted when the plasma generation device 40 or the sputtering device 70 is disposed in the chamber 10.

The workpiece holding wall 101 of the housing unit 100 is formed of a plate-like member having a large number of holes such as a punching plate. In the housing unit 100, the workpiece holding wall 101 is formed of a member having a large number of holes, such that air permeability is provided between the inside and the outside of the housing unit 100 via the workpiece holding wall 101.

An attachment plate 104 used when the housing unit 100 is supported by the housing unit support member 110 is disposed on an outer surface side of the workpiece holding wall 101 in the housing unit 100. A plurality of the attachment plates 104 are disposed on the outer surface side of the workpiece holding wall 101 so that a thickness direction of the attachment plate 104 is the same as the thickness direction of the side wall 102. In the present embodiment, the attachment plates 104 are disposed at two positions between the pair of side walls 102. In the attachment plate 104, a notch (not illustrated) through which the attachment member 113 passes is formed at a position where the attachment member 113 of the housing unit support member 110 is disposed when viewed in the length direction Y. Therefore, when the housing unit 100 is supported by the housing unit support member 110, the attachment member 113 of the housing unit support member 110 is inserted into the notch formed in the attachment plate 104 of the housing unit 100. As a result, the housing unit 100 is supported by the housing unit support member 110 in a state in which relative movement of the housing unit 100 with respect to the housing unit support member 110 in a direction in which the housing unit support member 110 swings can be restricted.

In addition, the surface treatment device 1*a* includes the correction plates 130*a* that are disposed in at least one of the housing unit 100, the plasma generation device 40, or the sputtering device 70 and limit a range in which the workpiece W is housed. In the present embodiment, the correction plates 130*a* are attached to the plasma generation device 40 and the sputtering device 70.

A pair of correction plates 130*a* are disposed between the pair of side walls 102 in a direction parallel to the side walls 102 of the housing unit 100 in a case where the plasma generation device 40 is positioned in the chamber 10 in which the housing unit 100 is disposed. That is, the pair of correction plates 130*a* are disposed so as to face each other.

Each of the pair of correction plates 130*a* includes an attachment portion 132, and the attachment portion 132 of the correction plate 130*a* attached to the plasma generation device 40 is attached to a lower surface of the holding member 58 of the plasma generation device 40. That is, the attachment portion 132 is positioned at an upper end of the correction plate 130*a* when the correction plate 130*a* is viewed in the width direction X, and the attachment portion 132 is formed in a plate shape whose thickness direction is the vertical direction Z. As the attachment portion 132 formed in this manner is attached to the lower surface of the holding member 58 of the plasma generation device 40, the correction plate 130*a* is attached to the plasma generation device 40. Further, as the correction plate 130*a* is attached to the holding member 58 of the plasma generation device 40, an interval between the pair of correction plates 130*a* is substantially the same as the width of the support plate 50 of the plasma generation device 40 in the length direction Y. Specifically, the interval between the pair of correction plates 130*a* attached to the plasma generation device 40 is substantially the same as the width of the gas introduction portion 57 of the plasma generation device 40 in the length direction Y.

In addition, the width of the correction plate 130*a* attached to the plasma generation device 40 in the width direction X is substantially the same as the width of the support plate 50 of the plasma generation device 40 in the same direction. In addition, the height of the correction plate 130*a* in the vertical direction Z is a height at which the correction plate 130*a* can be separated from the housing unit 100 in the vertical direction Z (that is, the first opening/closing member 20 can be opened and closed) when the plasma generation device 40 is positioned in the chamber 10 in which the housing unit 100 is supported by the housing unit support member 110. Further, when the plasma generation device 40 is positioned in the chamber 10, a gap through which the workpiece W cannot pass is formed between a lower end position of the correction plate 130*a* in the vertical direction Z and the housing unit 100. As a result, when the plasma generation device 40 is positioned in the chamber 10, the workpiece W is housed in the housing space R illustrated in FIG. 9 formed by the two correction plates 130*a* facing each other and the workpiece holding wall 101. Note that the housing space R is formed in a region where the plasma generation device 40 can uniformly emit plasma, that is, a region where the surface treatment of the workpiece W is appropriately performed.

Note that the pair of correction plates 130*a* attached to the sputtering device 70 also have the same size and positional relationship as those of the pair of correction plates 130*a* attached to the plasma generation device 40, and the workpiece W is housed in the housing space R illustrated in FIG. 10. Then, the housing space R is formed in a region where the sputtering device 70 can uniformly release the ions emitted from the target 84, that is, in a region where the surface treatment of the workpiece W is appropriately performed.

1-5. Description of Swinging State of Housing Unit

Figure 14:
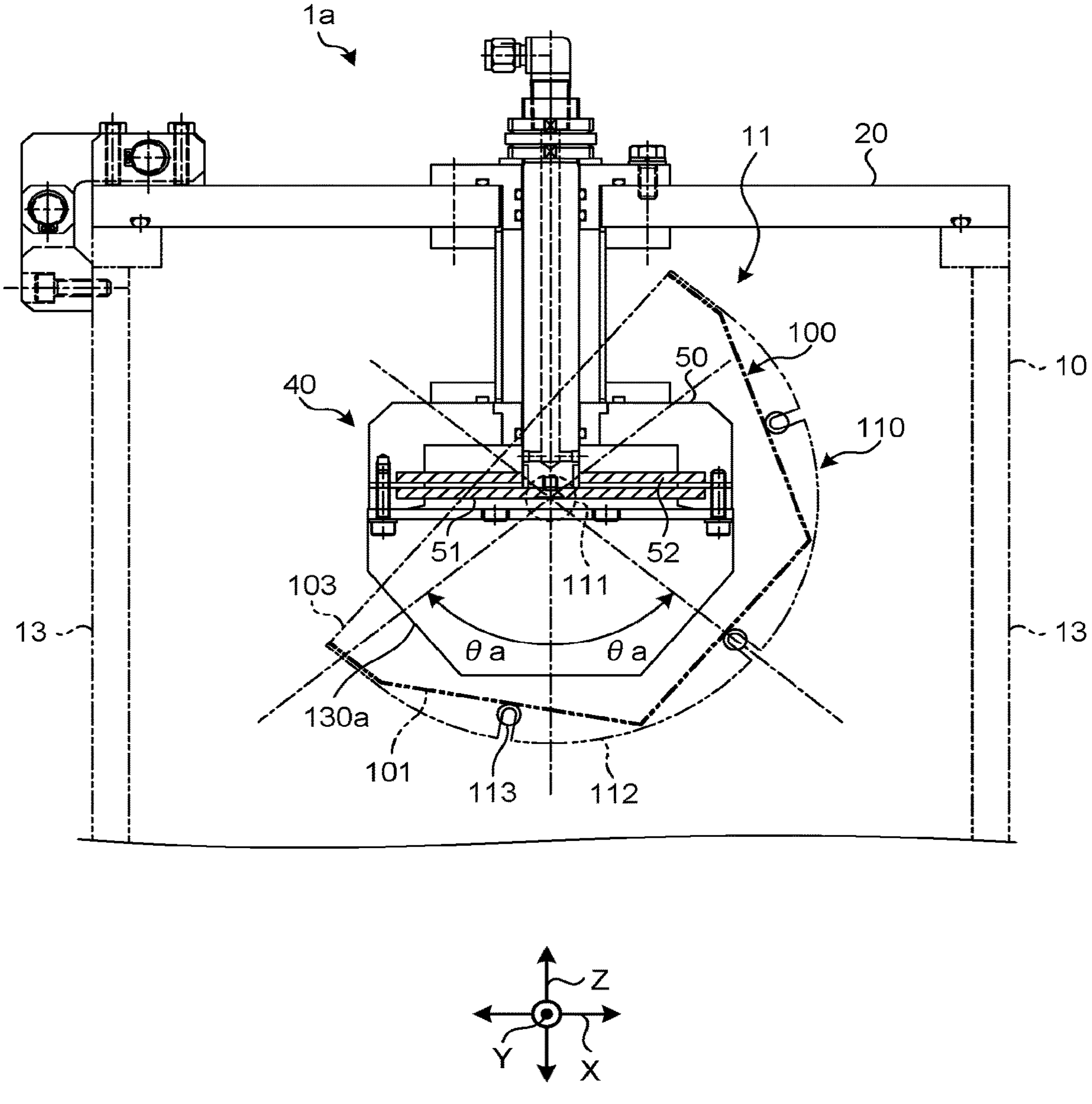
FIG. 14 is an explanatory diagram illustrating a state in which the housing unit and the housing unit support member illustrated in FIG. 11 swing.
Figure 15:
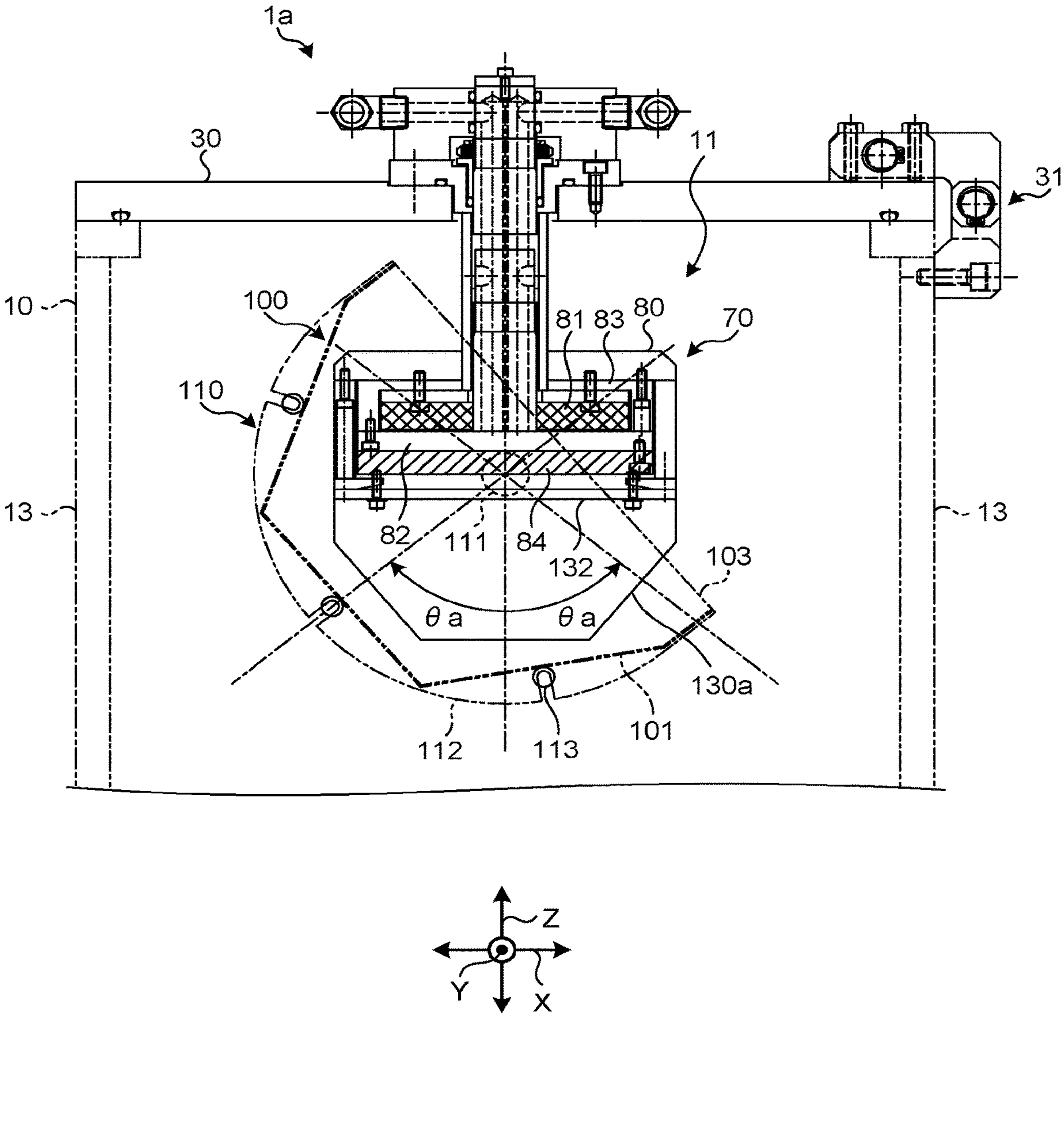
FIG. 15 is an explanatory diagram illustrating a state in which the housing unit and the housing unit support member illustrated in FIG. 12 swing.

FIG. 14 is an explanatory diagram illustrating a state in which the housing unit and the housing unit support member illustrated in FIG. 11 swing. FIG. 15 is an explanatory diagram illustrating a state in which the housing unit and the housing unit support member illustrated in FIG. 12 swing. As illustrated in FIGS. 14 and 15, the correction plate 130*a* attached to the plasma generation device 40 and the correction plate 130*a* attached to the sputtering device 70 have substantially the same shape, and are disposed at substantially the same position in the chamber 10 when positioned in the chamber 10. Further, the correction plate 130*a* is chamfered at opposite sides in the width direction X and a lower end side, such that the correction plate 130*a* does not abut on the housing unit 100 when the housing unit 100 swings integrally with the housing unit support member 110 around the swing shafts 111.

The housing unit 100 and the housing unit support member 110 swing around the swing shafts 111 in a range of an angle ±θa with respect to the vertical direction Z. Note that the swing angle range is set so that the workpiece W housed in the housing unit 100 does not fall from the housing unit 100 into the chamber 10 when the housing unit 100 swings. That is, the angle θa is appropriately set according to the size of the workpiece W and the amount of the workpiece W. The value of θa is set to, for example, about 50°. That is, the housing unit 100 and the housing unit support member 110 swing in an angle range of about 50° from a position where the housing unit support member 110 is neutral to both sides in the swing direction, that is, in an angle range of about 100° in total. The position at which the housing unit support member 110 is neutral herein refers to a position at which the opening 103 of the housing unit 100 faces directly upward, that is, the upper side in the vertical direction Z, when the housing unit 100 is mounted on the housing unit support member 110.

A swing pattern indicating how to swing the housing unit 100 with time is arbitrarily set by a voltage waveform applied to the servomotor 120 (see FIGS. 9 and 10). A representative voltage waveform is a sinusoidal waveform, but is not limited thereto. Details will be described in a second embodiment.

Note that, although FIGS. 14 and 15 illustrate an example in which the housing unit 100 swings in the width direction X, the housing unit 100 may swing in the length direction Y.

As the housing unit 100 swings, the workpiece W housed in the housing unit 100 is stirred inside the housing unit 100. As a result, the entire surface of the workpiece W to be subjected to surface treatment by the plasma generation device 40 is uniformly irradiated with plasma, such that uniform surface treatment is performed. In addition, the periphery of the workpiece W to be subjected to surface treatment by the sputtering device 70 is irradiated with the ions emitted from the target 84 (see FIG. 7), such that a uniform thin film is formed.

Note that a pattern for stirring the workpiece W is not limited to a pattern for swinging the workpiece W in a θdirection as described above. That is, the workpiece W may be stirred by swinging (vibrating) the housing unit 100 in the vertical direction Z.

Figure 16:
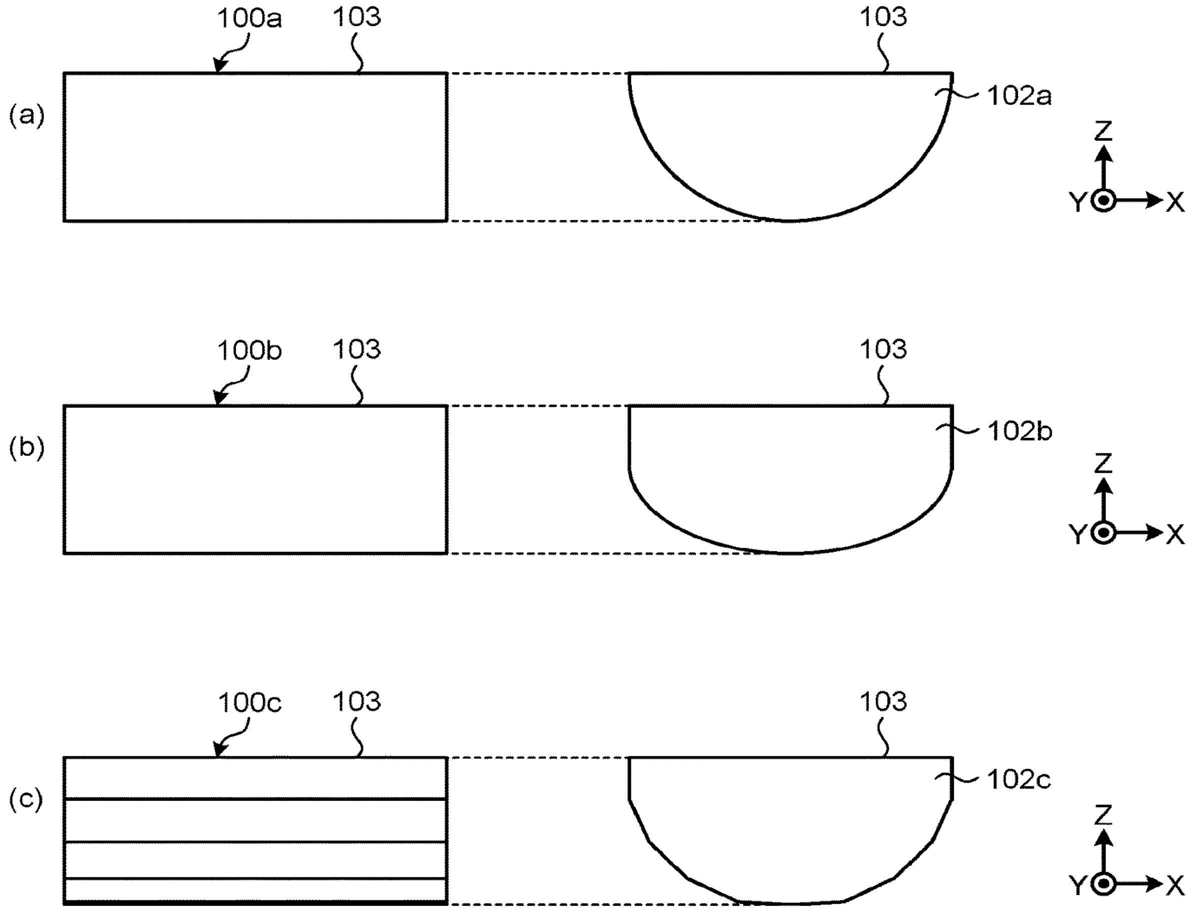
FIG. 16 is a front and side view illustrating an example of a shape of the housing unit.

Next, the shape of the bottom portion of the housing unit 100 will be described with reference to FIG. 16. FIG. 16 is a front view and a side view illustrating an example of the shape of the housing unit. As described above, the side wall 102 of the housing unit 100 has a shape in which the width of the housing unit 100 in the width direction X decreases as approaching the bottom portion 15 of the chamber 10 from the opening 103 of the housing unit 100. Specifically, as illustrated at (b) in FIG. 16, a housing unit 100*a* having an arc-shaped side wall 102*a* may be provided. As illustrated at (c) in FIG. 16, a housing unit 100*b* having a U-shaped side wall 102*b* may be provided. Furthermore, as illustrated at (c) in FIG. 16, a housing unit 100*c* having a polygonal side wall 102*c* may be provided.

In all of the side walls 102*a*, 102*b*, and 102*c* illustrated in FIG. 16, the housing units 100*a*, 100*b*, and 100*c* are narrower toward the bottom portions thereof, respectively, and therefore when the housing unit swings, the workpiece W positioned so as to be in contact with an end portion of the side wall 102*a*, 102*b*, or 102*c* among the workpieces W housed in the housing unit easily moves along the end portion of the side wall 102*a*, 102*b*, or 102*c*. Then, as the workpiece W positioned so as to be in contact with the end portion of the side wall 102*a*, 102*b*, or 102*c* moves, the workpiece W housed on the upper side also easily moves. That is, the workpiece W is easily stirred. Therefore, the surface of the workpiece W is uniformly irradiated with the plasma emitted from the plasma generation device 40. In addition, the surface of the workpiece W is uniformly irradiated with the ions emitted from the sputtering device 70.

1-6. Description of Configuration of Pump Unit

Figure 17:
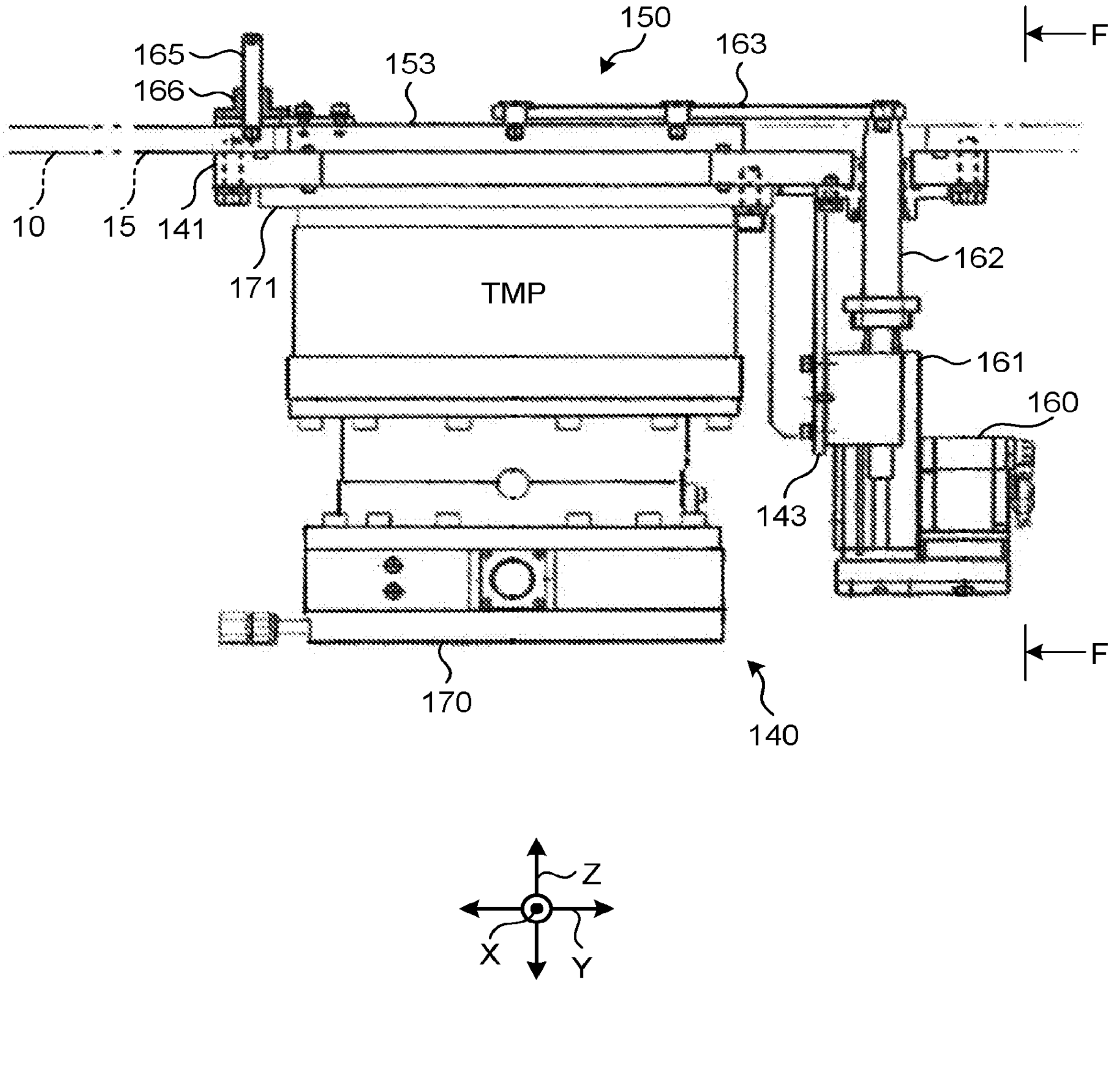
FIG. 17 is a detailed view of a pump unit illustrated in FIG. 1.
Figure 18:
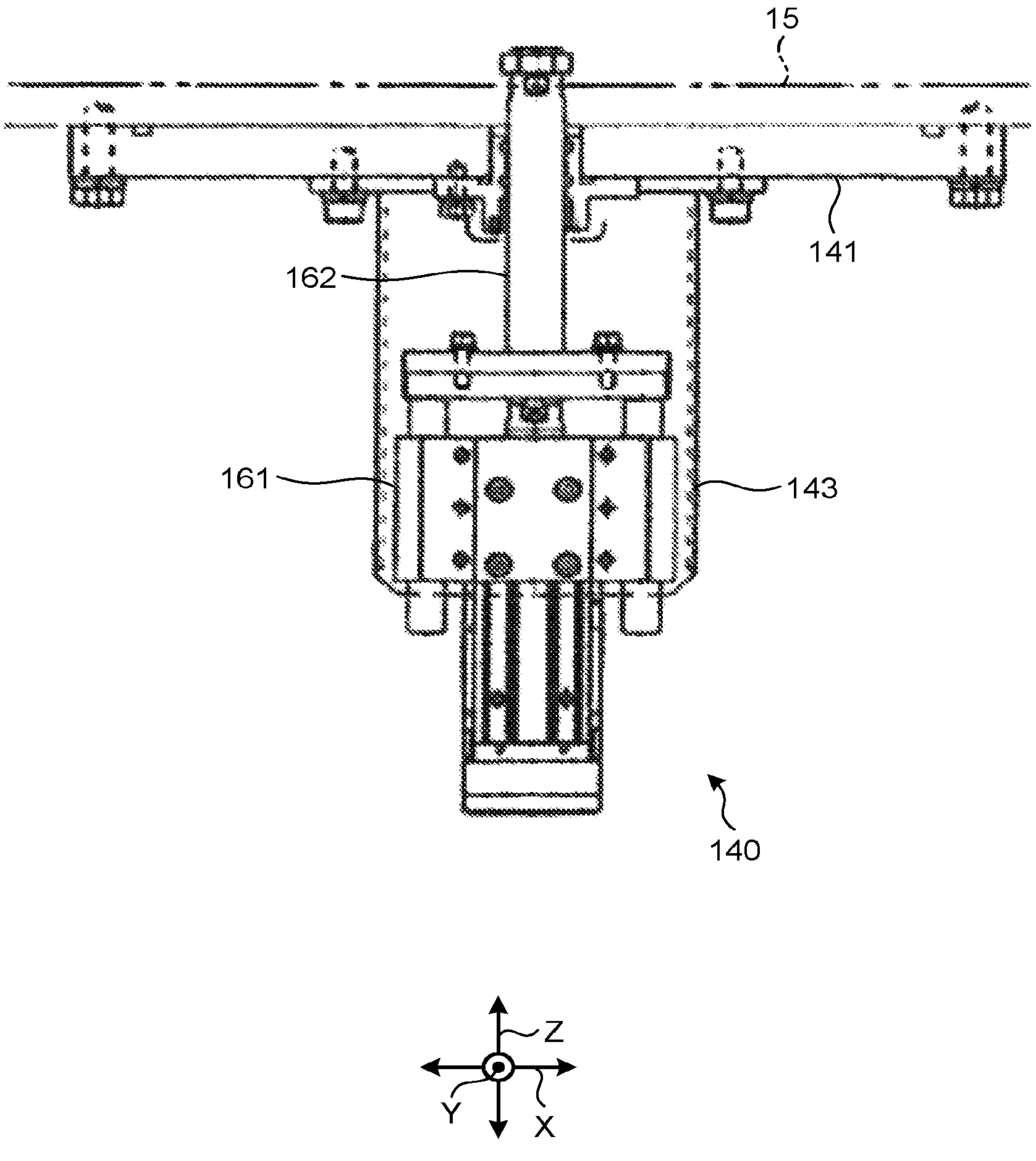
FIG. 18 is a detailed view of a lifting shaft and a worm jack when viewed from an F-F direction of FIG. 17.
Figure 19:
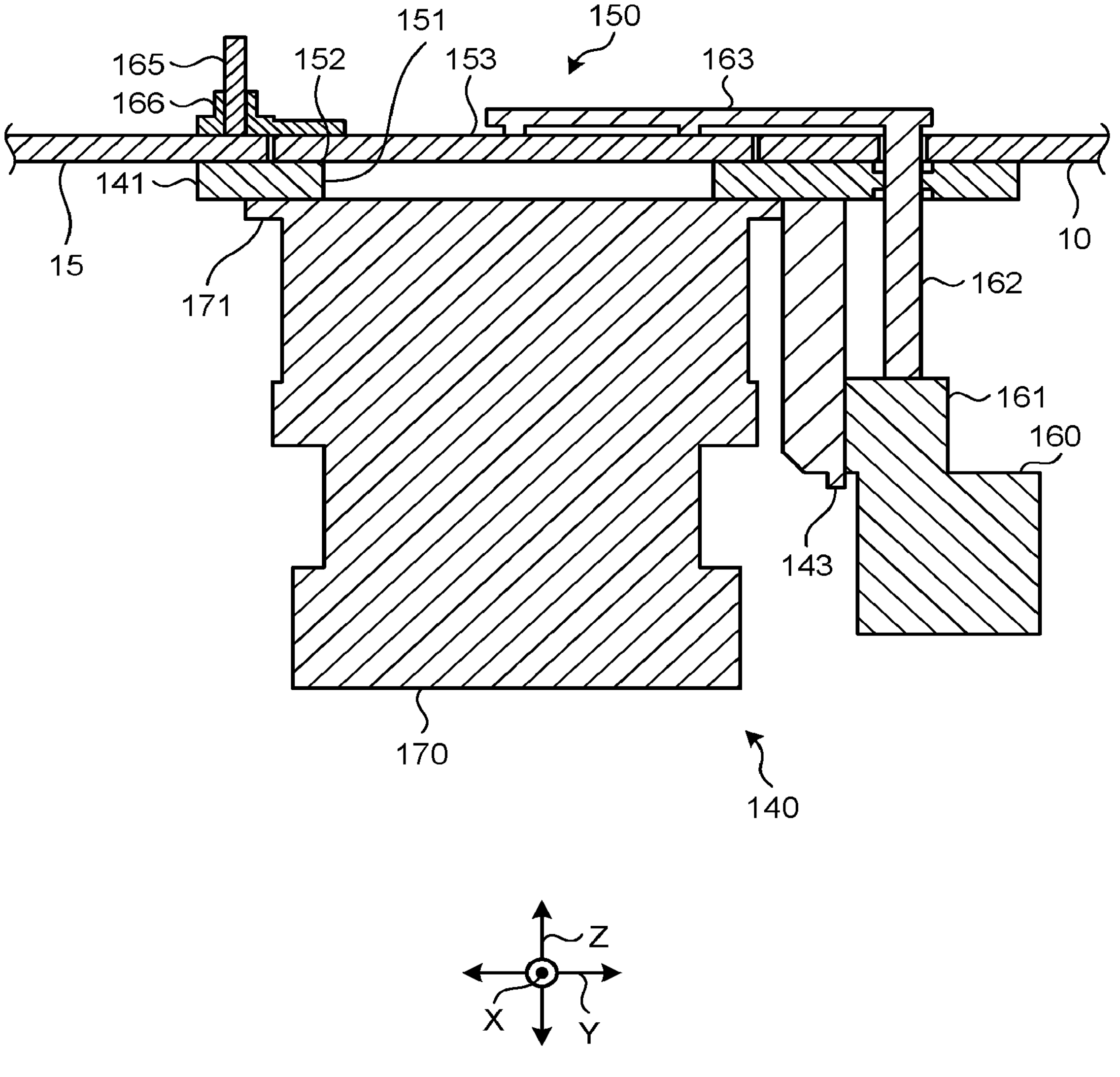
FIG. 19 is a schematic cross-sectional view of FIG. 17.
Figure 20:
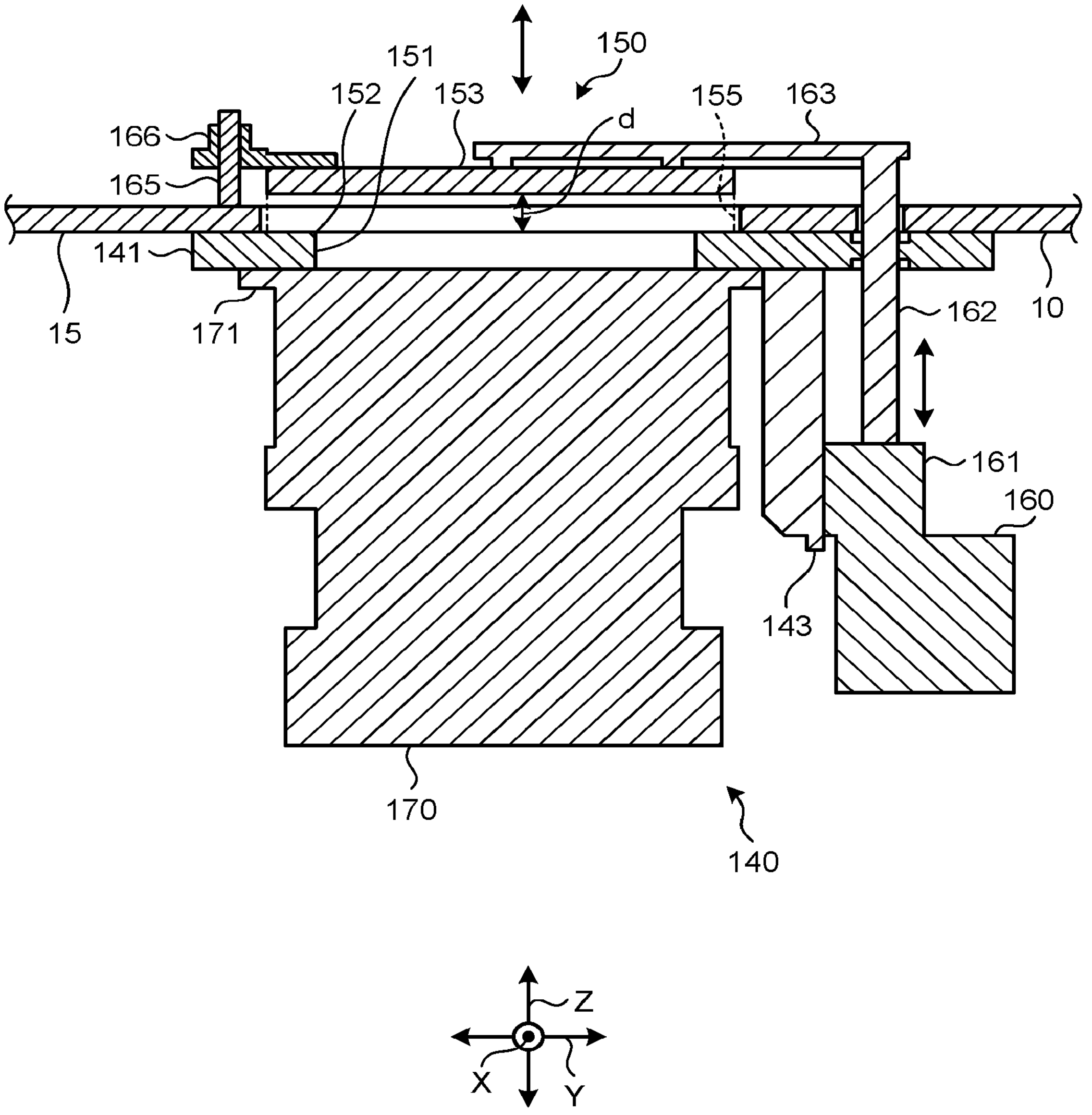
FIG. 20 is an explanatory diagram illustrating a state in which a lifting valve illustrated in FIG. 19 opens an opening.

FIG. 17 is a detailed view of the pump unit illustrated in FIG. 1. FIG. 18 is a detailed view of the lifting shaft and the worm jack when viewed from an F-F direction of FIG. 17. FIG. 19 is a schematic cross-sectional view of FIG. 17. FIG. 20 is an explanatory diagram illustrating a state in which the lifting valve illustrated in FIG. 19 opens an opening.

The pump unit 140 attached to the bottom portion 15 of the chamber 10 includes the flow rate adjustment valve 150 and the turbo molecular pump 170. As illustrated in FIG. 19, the flow rate adjustment valve 150 includes a flow path portion 151 in which a fluid flows, the lifting valve 153 that opens and closes the opening 152 formed at one end of the flow path portion 151, and a servo actuator 160 which is a driving means that causes the lifting valve 153 to perform an opening/closing operation. The turbo molecular pump 170 is a pump that sucks the fluid flowing in the flow path portion 151 of the flow rate adjustment valve 150.

Specifically, the flow path portion 151 of the flow rate adjustment valve 150 is formed in an attachment flange 141 for attaching the pump unit 140 to the chamber 10, and the turbo molecular pump 170 is attached to the attachment flange 141 by attaching a pump flange 171 of the turbo molecular pump 170 to the attachment flange 141. The attachment flange 141 is a plate-shaped member, and the flow path portion 151 is formed as a hole penetrating in the thickness direction of the attachment flange 141. The opening 152 of the flow path portion 151 is positioned on one end side of the flow path portion 151 penetrating through the attachment flange 141 in this manner, and the turbo molecular pump 170 is attached to a surface of the attachment flange 141 on a side opposite to a surface on a side where the opening 152 of the flow path portion 151 is positioned. As a result, the turbo molecular pump 170 is disposed on a side opposite to the end portion side where the opening 152 is formed in the flow path portion 151.

The pump unit 140 is attached to the chamber 10 by attaching the attachment flange 141 to a lower surface of the bottom portion 15 of the chamber 10. The attachment flange 141 is attached so that a surface of the attachment flange 141 on a side where the opening 152 of the flow path portion 151 is positioned is positioned adjacent to the chamber 10, and a surface of the attachment flange 141 on a side where the turbo molecular pump 170 is attached is positioned on a side opposite from the chamber 10. As a result, the attachment flange 141 is attached so that a flow direction when the fluid flows in the flow path portion 151 is the vertical direction Z and the opening 152 is positioned at an upper end of the flow path portion 151. In other words, the flow path portion 151 is disposed so that an opening direction of the opening 152 is the vertical direction Z. In a state in which the attachment flange 141 is attached to the bottom portion 15 of the chamber 10, the opening 152 of the flow path portion 151 is opened to the inside of the chamber 10, and the flow path portion 151 communicates with the inside of the chamber 10.

The lifting valve 153 of the flow rate adjustment valve 150 is disposed in the chamber 10, and is disposed on the opening 152 side of the flow path portion 151, that is, on an upper side of the opening 152. The lifting valve 153 can open and close the opening 152 by changing a distance d (see FIG. 20) from the opening 152 in the vertical direction Z. That is, when closing the opening 152, the lifting valve 153 can cover the entire region of the opening 152 to close the opening 152, and when opening the opening 152, the lifting valve 153 can be separated from the opening 152 in the opening direction of the opening 152, that is, in the vertical direction Z, to open the opening 152. Each of the opening 152 and the lifting valve 153 has a substantially circular shape when viewed in the opening direction of the opening 152, and the diameter of the lifting valve 153 is larger than that of the opening 152. Note that, in this case, the substantially circular shape means that each of the opening 152 and the lifting valve 153 is formed in a substantially circular shape regardless of a dimensional error at the time of manufacturing or the presence or absence of slight unevenness.

The servo actuator 160 that opens and closes the lifting valve 153 causes the lifting valve 153 to perform an opening/closing operation for the opening 152 by moving the lifting valve 153 in the opening direction of the opening 152, that is, the vertical direction Z. The servo actuator 160 is disposed on a side of the surface of the attachment flange 141 to which the turbo molecular pump 170 is attached, and is supported by a driving means support portion 143. That is, the servo actuator 160 is attached to the attachment flange 141 via the driving means support portion 143.

The driving force generated by the servo actuator 160 is transmitted to the lifting valve 153 via the worm jack 161, the lifting shaft 162, and a connection member 163. Then, the lifting valve 153 moves in the vertical direction Z by the transmitted driving force to open and close the opening 152. Among them, the worm jack 161 moves the lifting shaft 162 in an axial direction of the lifting shaft 162 by the driving force transmitted from the servo actuator 160. The lifting shaft 162 is disposed so that the axial direction thereof is along the vertical direction Z. Therefore, when the driving force from the servo actuator 160 is transmitted from the worm jack 161, the lifting shaft 162 moves in the vertical direction Z by the driving force. The lifting shaft 162 is disposed so as to penetrate through the bottom portion 15 of the chamber 10 and the attachment flange 141, and has an upper end positioned inside the chamber 10 and a lower end positioned outside the chamber 10 and below the attachment flange 141.

Note that a portion where the lifting shaft 162 penetrates through the attachment flange 141 is airtight, and the fluid does not flow on both sides of the portion where the lifting shaft 162 penetrates through the attachment flange 141. The lifting shaft 162 penetrates through the bottom portion 15 of the chamber 10.

The worm jack 161 is connected to a position near a lower end of the lifting shaft 162 and transmits the driving force transmitted from the servo actuator 160 from the position near the lower end of the lifting shaft 162 to the lifting shaft 162 to move the lifting shaft 162 in the vertical direction Z.

The connection member 163 is disposed in the chamber 10 and connects an upper end of the lifting shaft 162 and the lifting valve 153. That is, the connection member 163 is disposed over a surface of the lifting valve 153 opposite to a surface that opens and closes the opening 152 of the flow path portion 151, and the upper end of the lifting shaft 162, and is connected to both of the surfaces to connect the upper end of the lifting shaft 162 and the lifting valve 153. As a result, when the lifting shaft 162 moves in the vertical direction Z, the connection member 163 also moves in the vertical direction Z together with the lifting shaft 162, and the lifting valve 153 also moves in the vertical direction Z. The lifting valve 153 moves in the vertical direction Z by the driving force transmitted from the servo actuator 160 in this manner to open and close the opening 152 of the flow path portion 151.

The chamber 10 is provided with a valve guide 165 that guides the opening/closing operation of the lifting valve 153, and a guide engagement portion 166 that engages with the valve guide 165 is attached to the lifting valve 153. The valve guide 165 is formed in a bar-like shape extending in the vertical direction Z, which is a direction in which the lifting valve 153 moves when performing the opening/closing operation, and is disposed in the vicinity of a portion where the lifting valve 153 is positioned on an inner surface of the bottom portion 15 of the chamber 10.

Specifically, the valve guide 165 is disposed on a side of the lifting valve 153 that is opposite to a side where the lifting shaft 162 is positioned. The guide engagement portion 166 is attached to an upper surface side of the lifting valve 153, and is formed over the upper surface of the lifting valve 153 and the position of the valve guide 165. A through hole through which the valve guide 165 passes is formed in the guide engagement portion 166, and the valve guide 165 penetrates through the through hole formed in the guide engagement portion 166.

Since the guide engagement portion 166 is attached to the lifting valve 153, the guide engagement portion 166 also moves integrally when the lifting valve 153 moves. At this time, since the valve guide 165 extending in the vertical direction Z penetrates through the through hole formed in the guide engagement portion 166, the guide engagement portion 166 moves along the valve guide 165 when the guide engagement portion 166 moves together with the lifting valve 153. As a result, the valve guide 165 guides the movement of the lifting valve 153 to which the guide engagement portion 166 is attached, in the vertical direction Z.

The lifting valve 153 opens and closes the opening 152 of the flow path portion 151 by moving in the vertical direction Z, but when the lifting valve 153 opens the opening 152, the fluid flows from a portion between an outer peripheral portion of the lifting valve 153 and the attachment flange 141, between the inside of the chamber 10 and the flow path portion 151.

That is, when the lifting valve 153 closes the opening 152, a lower surface of the lifting valve 153 and an upper surface of the attachment flange 141 come into contact with each other, whereby the lifting valve 153 closes the opening 152. In this case, a path of the fluid between the inside of the chamber 10 and the flow path portion 151 is blocked by a contact portion between the lower surface of the lifting valve 153 and the upper surface of the attachment flange 141. Further, when the lifting valve 153 opens the opening 152, the lifting valve 153 moves upward, such that the lower surface of the lifting valve 153 is separated from the upper surface of the attachment flange 141. As a result, the fluid flows between the inside of the chamber 10 and the flow path portion 151 from a portion between the lower surface of the lifting valve 153 and the upper surface of the attachment flange 141 and flows to the outside of the chamber 10.

Therefore, when the lifting valve 153 opens the opening 152, a substantial opening of the path of the fluid flowing between the inside of the chamber 10 and the flow path portion 151 is a portion between the outer peripheral portion of the lower surface of the lifting valve 153 and the upper surface of the attachment flange 141. That is, the distance between the lower surface of the lifting valve 153 and the upper surface of the attachment flange 141 is changed by moving the lifting valve 153 in the vertical direction Z. Therefore, an opening formed between the outer peripheral portion of the lower surface of the lifting valve 153 and the upper surface of the attachment flange 141 functions as an adjustment opening 155 (see FIG. 20) whose opening area is changed by moving the lifting valve 153 in the vertical direction Z.

The adjustment opening 155 is an opening through which the fluid is distributed between the chamber 10 and the opening 152, and the opening area of the adjustment opening 155 is a distribution area DA (not illustrated) through which the fluid is distributed between the chamber 10 and the opening 152. The distribution area DA of the adjustment opening 155 is a value calculated by integrating the length of the outer peripheral portion of the lower surface of the lifting valve 153 and the distance between the lower surface of the lifting valve 153 and the upper surface of the attachment flange 141. That is, the distribution area DA is changed according to the distance between the lifting valve 153 and the attachment flange 141. That is, the distribution area DA increases as the distance between the lifting valve 153 and the attachment flange 141, that is, the distance d between the opening 152 of the flow path portion 151 and the lifting valve 153 increases, and the distribution area DA also decreases as the distance d between the opening 152 and the lifting valve 153 decreases. Therefore, the lifting valve 153 changes the distribution area DA with respect to the opening 152 as the distance d between the lifting valve 153 and the opening 152 in the opening direction of the opening 152 is changed.

The lifting valve 153 capable of changing the distribution area DA moves in the vertical direction Z by the servo actuator 160, and the servo actuator 160 moves the lifting valve 153 in the vertical direction Z based on a predetermined detection value. Specifically, the servo actuator 160 moves the lifting valve 153 based on a pressure in the chamber 10 detected by the vacuum gauge 180 (see FIG. 1). As a result, the servo actuator 160 changes the distribution area DA based on the pressure in the chamber 10 detected by the vacuum gauge 180.

1-7. Description of Functions of First Embodiment

Hereinafter, the functions of the surface treatment device 1*a* according to the present embodiment will be described. In the surface treatment device 1*a* according to the embodiment, for example, the workpiece W formed of a difficult-to-plate material such as a resin material on which a plating layer is hardly formed by normal plating is subjected to surface treatment so that the plating layer is easily formed on the surface by plating. Note that the workpiece W to be subjected to the surface treatment by the surface treatment device 1*a* according to the present embodiment is assumed to be a member having a relatively small size as illustrated in FIG. 1, and the surface treatment device 1*a* is suitable for collectively performing the surface treatment on a large number of the workpieces W having a small size.

Note that the workpiece W to be subjected to the surface treatment by the surface treatment device 1*a* is a member having a size larger than multiple holes formed in the workpiece holding wall 101 of the housing unit 100 and not passing through the holes formed in the workpiece holding wall 101 of the housing unit 100.

Figure 21:
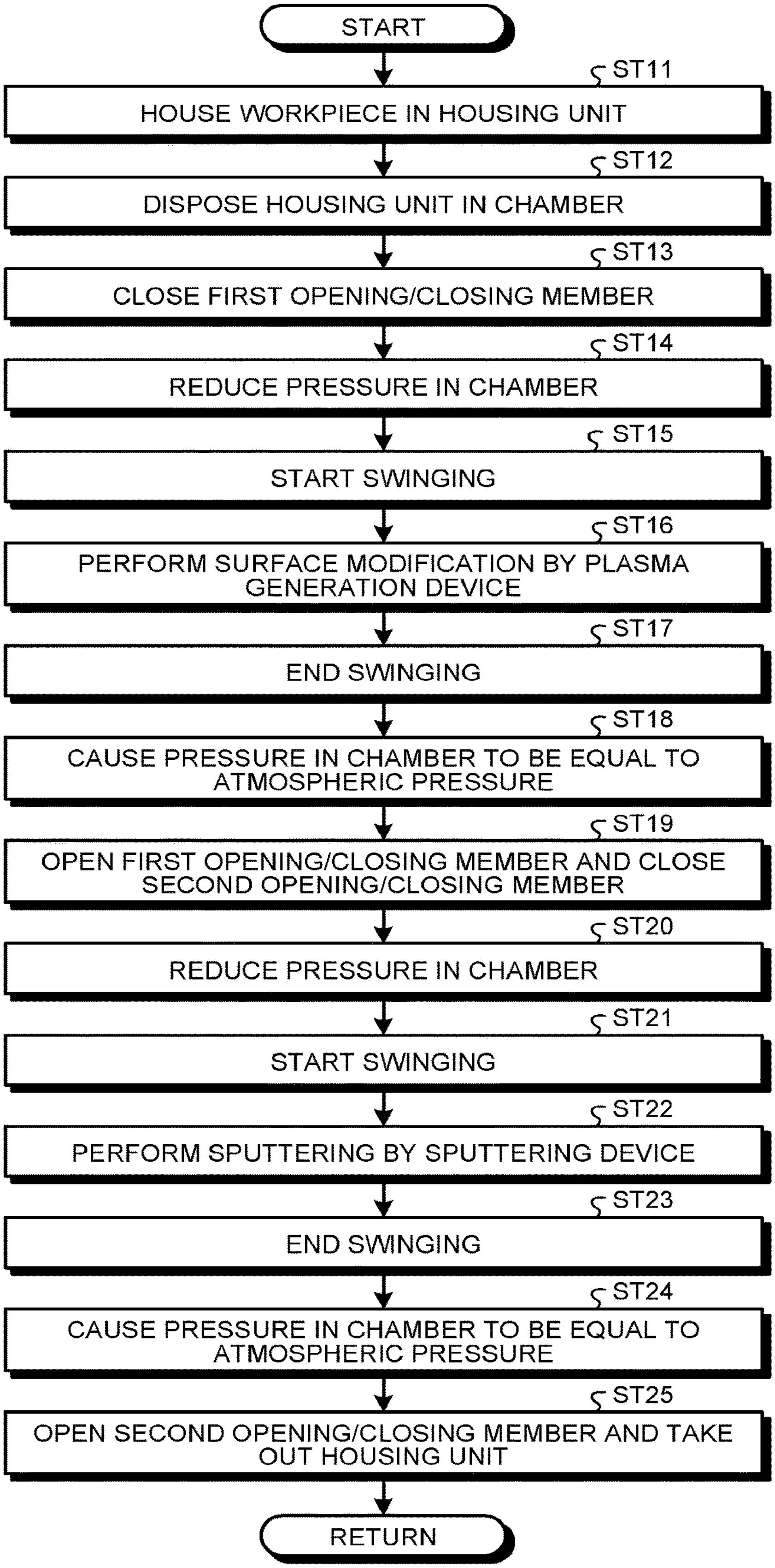
FIG. 21 is a flowchart illustrating a procedure when surface treatment of a workpiece is performed by the surface treatment device according to the embodiment.

FIG. 21 is a flowchart illustrating a procedure when surface treatment of the workpiece is performed by the surface treatment device according to the embodiment. When the surface treatment is performed on the workpiece W by the surface treatment device 1*a*, the workpiece W is first housed in the housing unit 100 (Step ST11). That is, the workpiece W is housed in the housing unit 100 through the opening 103 of the housing unit 100.

Next, the housing unit 100 housing the workpiece W is disposed in the chamber 10 (Step ST12). The housing unit 100 is disposed in the chamber 10 by mounting the housing unit 100 housing the workpiece W on the housing unit support member 110 in the chamber 10. That is, the housing unit 100 housing the workpiece W is inserted into the chamber 10 in a state in which both the first opening/closing member 20 and the second opening/closing member 30 are opened, and the housing unit 100 is attached to the housing unit support member 110. As a result, the workpiece W is housed in the chamber 10.

Once the workpiece W is housed in the chamber 10, the opening 11 of the chamber 10 is closed by the first opening/closing member 20 by rotation of the first opening/closing member 20 around the hinge portion 21 (Step ST13). As a result, a part of the plasma generation device 40 attached to the first opening/closing member 20 is positioned in the chamber 10 (see FIGS. 3 and 9). In this case, at least the plate-shaped conductor portions 51 and 52 supported by the support plate 50 of the plasma generation device 40 are positioned in the chamber 10, and the plate-shaped conductor portions 51 and 52 are inserted into the housing unit 100 through the opening 103 of the housing unit 100 disposed in the chamber 10. As a result, the plate-shaped conductor portions 51 and 52 of the plasma generation device 40 are positioned above the workpiece W housed in the housing unit 100 and relatively near the workpiece W.

The pair of correction plates 130*a* that limit the range in which the workpiece W is housed is attached to the plasma generation device 40. Since the correction plates 130*a* are disposed below the plate-shaped conductor portions 51 and 52 of the plasma generation device 40, the correction plates 130*a* are also inserted into the housing unit 100 when the plate-shaped conductor portions 51 and 52 are inserted into the housing unit 100 through the opening 103 of the housing unit 100. As a result, the workpiece W housed in the housing unit 100 is positioned between the pair of correction plates 130*a* positioned in the housing unit 100.

When the housing unit 100 housing the workpiece W is disposed in the chamber 10 and the plasma generation device 40 is positioned in the chamber 10 by closing the first opening/closing member 20, the pressure in the chamber 10 is reduced by the pump unit 140 (Step ST14). At this time, a path of the gas inflow portion 16 through which the gas used for sputtering flows into the chamber 10 is closed, such that the gas does not flow from the gas inflow portion 16. Note that, when the pressure in the chamber 10 is reduced by the pump unit 140, the turbo molecular pump 170 is operated, such that the turbo molecular pump 170 sucks the gas in the chamber 10 and discharges the sucked gas to the outside of the chamber 10. In addition, the pump unit 140 adjusts the flow rate of the gas flowing from the inside of the chamber 10 toward the turbo molecular pump 170 by operating the flow rate adjustment valve 150 in a state in which the gas in the chamber 10 is sucked by the turbo molecular pump 170. As a result, the pressure in the chamber 10 is adjusted.

More specifically, the pump unit 140 adjusts the distribution area DA of the adjustment opening 155 by moving the lifting valve 153 in the vertical direction Z based on the pressure in the chamber 10 detected by the vacuum gauge 180, and adjusts the flow rate of the gas flowing from the inside of the chamber 10 toward the flow path portion 151 to reduce the pressure in the chamber 10 to a predetermined set pressure. Note that the set pressure in this case is set to, for example, a pressure suitable for generating plasma by the plasma generation device 40 and performing surface treatment of the workpiece W, such as a pressure of about 10 Pa to 300 Pa. The pump unit 140 adjusts the pressure in the chamber 10 to a pressure of about 10 Pa to 300 Pa according to the set pressure, thereby bringing the inside of the chamber 10 from a low vacuum state to a medium vacuum state.

After the pressure in the chamber 10 is reduced to the set pressure, the surface treatment device 1*a* starts swinging of the housing unit 100 (Step ST15). The housing unit 100 swings by driving the servomotor 120 which is the swinging means for swinging the housing unit 100. When the servomotor 120 is driven, the driving force generated by the servomotor 120 is transmitted from the output shaft 121 of the servomotor 120 to the housing unit support member 110 via the drive shaft 125. The housing unit support member 110 to which the driving force from the servomotor 120 is transmitted swings around the swing shafts 111 of the housing unit support member 110 including the drive shaft 125 and the support shaft 116 (see FIG. 9). As a result, the housing unit 100 supported by the housing unit support member 110 swings integrally with the housing unit support member 110.

When the housing unit 100 swings, an inertial force generated by the housing unit 100 swinging acts on the workpiece W housed in the housing unit 100. Then, the workpiece W housed in the housing unit 100 moves in the housing unit 100 by the inertial force, or the workpieces W collide with each other and turn over.

Note that, in a case of swinging the housing unit 100 by the driving force generated by the servomotor 120, it is preferable to include an operation of rapidly changing the speed or acceleration. By rapidly changing the swing speed or acceleration of the housing unit 100, the workpiece W can more easily move in the housing unit 100. In addition, the workpiece W can turn over more easily in the housing unit 100.

After the housing unit 100 starts to swing, the surface treatment device 1*a* performs surface modification on the workpiece W by the plasma generation device 40 (Step ST16). When the surface modification is performed by the plasma generation device 40, while the plasma generation gas is supplied to the gas introduction portion 57 (see FIGS. 5 and 6), the gap portion 56 between the parallel plate type plate-shaped conductor portions 51 and 52 (see FIGS. 5 and 6) is brought into a high frequency discharge state, and plasma is generated. The supply of the plasma generation gas to the gas introduction portion 57 is performed by supplying the plasma generation gas from the gas supply portion 44 to the gas flow path 42 and discharging the plasma generation gas to the gas introduction portion 57 through the gas supply hole 43 formed on one end side of the gas flow path 42. Further, when the gap portion 56 between the plate-shaped conductor portions 51 and 52 is brought into the high frequency discharge state, the radio frequency power supply 61 is operated. In the gap portion 56, since the plasma generation gas supplied to the gas introduction portion 57 flows through the through hole 54 formed in the plate-shaped conductor portion 52, the plasma generation gas flowing in the gap portion 56 is turned into plasma in the gap portion 56 in the high frequency discharge state. At this time, since the pressure in the chamber 10 is reduced to a pressure suitable for generating plasma, as the gap portion 56 is brought into the high frequency discharge state while causing the plasma generation gas to flow to the gap portion 56, plasma is efficiently generated in the gap portion 56.

The plasma generated in the gap portion 56 passes through the through hole 53 formed in the plate-shaped conductor portion 51 and flows out from the gap portion 56 toward a side opposite to a side where the plate-shaped conductor portion 52 is positioned. That is, the plasma generated in the gap portion 56 flows out to the lower side in the vertical direction Z through the through hole 53 of the plate-shaped conductor portion 51.

At this time, the diameter of the through hole 53 of the plate-shaped conductor portion 51 is smaller than the diameter of the through hole 54 formed in the plate-shaped conductor portion 52. Therefore, the plasma gas, which is the gas converted into plasma in the gap portion 56, flows out from the through hole 53 to the lower side in the vertical direction Z at a relatively high flow velocity. Since the workpiece W housed in the housing unit 100 is positioned below the plate-shaped conductor portion 51 in the vertical direction Z, the workpiece W housed in the housing unit 100 is irradiated with the plasma gas flowing out from the through hole 53 of the plate-shaped conductor portion 51. The workpiece W is subjected to surface modification using the plasma generated by the plasma generation device 40 as described above. That is, the workpiece W is subjected to surface treatment using the plasma with which the workpiece W is irradiated.

Specifically, an example of the surface modification performed using the plasma is surface roughening in which ions in the plasma gas collide with the workpiece W to roughen the surface of the workpiece W. Examples of other surface modification performed using plasma include cleaning of the surface of the workpiece W using plasma, and generation of a hydrophilic functional group on the surface of the workpiece W using plasma.

Since the pair of correction plates 130*a* that limit the range in which the workpiece W is housed are attached to the plasma generation device 40, the plasma gas flowing out from the through hole 53 of the plate-shaped conductor portion 51 flows between the pair of correction plates 130*a*. Since the workpiece W is housed between the pair of correction plates 130*a*, when the plasma gas flows between the pair of correction plates 130*a*, the plasma gas uniformly covers the workpiece W. Therefore, the workpiece W is efficiently subjected to surface treatment using the plasma gas.

Further, since the housing unit 100 swings while the plasma gas is blown, the workpiece W moves or turns over inside the housing unit 100, such that the plasma gas reaches the entire surface of the workpiece W. That is, the entire surface of the workpiece W housed in the housing unit 100 is uniformly exposed to the plasma by the swinging of the housing unit 100. Thus, even in a case where the workpiece W has a complicated shape, the entire surface of the workpiece W having the complicated shape is uniformly subjected to the surface treatment.

When the surface modification is performed by the plasma generation device 40 for a predetermined time, the surface treatment device 1*a* stops the generation of the plasma in the plasma generation device 40.

Then, the surface treatment device 1*a* stops the driving of the servomotor 120 to end the swinging of the housing unit 100 (Step ST17). At that time, the housing unit support member 110 stops at the neutral position, that is, in the state illustrated in FIG. 11.

When the generation of plasma in the plasma generation device 40 is stopped and the housing unit support member 110 is also stopped, the surface treatment device 1*a* causes the pressure in the chamber 10 to be equal to the atmospheric pressure (Step ST18). When the pressure in the chamber 10 is made equal to the atmospheric pressure, the pump unit 140 is stopped, and a pressure adjustment valve (not illustrated) installed in the chamber 10 is opened to take air around the chamber 10 into the chamber 10. As a result, the pressure in the chamber 10 that has been reduced is increased, and the pressure in the chamber 10 is made equal to the atmospheric pressure.

When the pressure in the chamber 10 is made equal to the atmospheric pressure, the first opening/closing member 20 is opened and the second opening/closing member 30 is closed (Step ST19). Since the pressure in the chamber 10 is made substantially equal to the atmospheric pressure outside the chamber 10, the first opening/closing member 20 can be easily opened by rotating around the hinge portion 21. Once the first opening/closing member 20 is opened, the second opening/closing member 30 attached at a position different from the first opening/closing member 20 in the vicinity of the opening 11 of the chamber 10 is closed.

When the second opening/closing member 30 is closed, similarly to the first opening/closing member 20, the opening 11 of the chamber 10 is closed by the second opening/closing member 30 by rotating the second opening/closing member 30 around the hinge portion 31. As a result, a part of the sputtering device 70 attached to the second opening/closing member 30 is positioned in the chamber 10 (see FIGS. 4 and 10). In this case, at least the target 84 supported by the support plate 80 of the sputtering device 70 is positioned in the chamber 10, such that the target 84 is inserted into the housing unit 100 through the opening 103 of the housing unit 100 disposed in the chamber 10. As a result, the target 84 of the sputtering device 70 is positioned above the workpiece W housed in the housing unit 100 and relatively near the workpiece W.

The pair of correction plates 130*a* that limit the range in which the workpiece W is disposed are attached to the sputtering device 70. Since the correction plates 130*a* are disposed below the target 84 of the sputtering device 70, the correction plates 130*a* are also inserted into the housing unit 100 when the target 84 is inserted into the housing unit 100 through the opening 103 of the housing unit 100. As a result, the workpiece W housed in the housing unit 100 is positioned between the pair of correction plates 130*a* positioned in the housing unit 100.

When the sputtering device 70 is positioned in the chamber 10 by closing the second opening/closing member 30, the pressure in the chamber 10 is reduced by the pump unit 140 (Step ST20). The pressure in the chamber 10 is reduced in the same manner as described in Step ST14.

After the pressure in the chamber 10 is reduced to the set pressure, the surface treatment device 1*a* starts swinging of the housing unit 100 (Step ST21). The housing unit 100 swings in the same manner as described in Step ST15 described above.

When the housing unit 100 swings, an inertial force generated as the housing unit 100 swings in a reciprocating manner in the swing direction acts on the workpiece W housed in the housing unit 100. Then, the workpiece W housed in the housing unit 100 moves in the housing unit 100 by the inertial force, or the workpieces W collide with each other and turn over.

After the housing unit 100 starts to swing, the surface treatment device 1*a* performs sputtering on the workpiece W by the sputtering device 70 (Step ST22). When sputtering is performed by the sputtering device 70, the gas used for sputtering flows into the chamber 10 from the gas inflow portion 16 disposed in the chamber 10. Then, the gas flowing in from the gas inflow portion 16 is ionized by the magnetic field generated by the magnet 81 of the sputtering device 70, and the atoms of the target 84 are ejected by causing ions to collide with the target 84. Since the pressure in the chamber 10 is reduced to a pressure suitable for performing sputtering by the pump unit 140, the gas used for sputtering flows into the chamber 10 from the gas inflow portion 16 and the magnetic field is generated by the magnet 81, such that the gas flowing in from the gas inflow portion 16 is efficiently ionized in the vicinity of the target 84 of the sputtering device 70.

In the present embodiment, since copper is used for the target 84, when ions of the gas ionized in the vicinity of the target 84 collide with the target 84, atoms of copper are ejected from the target 84. The atoms ejected from the target 84 are directed toward the lower side opposite to a side where the magnet 81 is positioned in the vertical direction Z.

Since the workpiece W housed in the housing unit 100 is positioned below the target 84 in the vertical direction Z, the atoms ejected from the target 84 move toward the workpiece W housed in the housing unit 100, closely adhere to the workpiece W, and are accumulated on the surface of the workpiece W. As a result, a thin film is formed on the surface of the workpiece W by a substance that forms the target 84. In the present embodiment, a copper thin film is formed on the surface of the workpiece W.

At this time, since the surface of the workpiece W is subjected to surface modification by the plasma generation device 40, when the sputtering device 70 forms a film on the surface of the workpiece W by using the substance that forms the target 84, the degree of adhesion of the thin film to the surface of the workpiece W can be increased. That is, since the sputtering device 70 forms a film on the surface of the workpiece W subjected to the surface modification by sputtering, a thin film can be formed on the surface of the workpiece W with a high degree of adhesion. Note that, when plating is performed on the surface of the workpiece W by another device in the subsequent step, the plating layer easily adheres to the formed thin film.

Note that, since the pair of correction plates 130*a* that limit the range in which the workpiece W is housed are attached to the sputtering device 70, the atoms ejected from the target 84 flow between the pair of correction plates 130*a*. Since the workpiece W is housed between the pair of correction plates 130*a*, the atoms ejected from the target 84 pass between the pair of correction plates 130*a* to uniformly cover the workpiece W. Therefore, a thin film is uniformly formed on the surface of the workpiece W.

The atoms ejected from the target 84 and attached to the surface of the workpiece W by performing sputtering by the sputtering device 70 closely adhere to the entire surface of each workpiece W as the workpiece W moves or turns over in the housing unit 100 by the swinging of the housing unit 100. That is, the atoms ejected from the target 84 uniformly adhere to the entire surface of the workpiece W housed in the housing unit 100 by the swinging of the housing unit 100, and the thin film formed by the accumulation of the substance that forms the target 84 is uniformly formed on the entire surface of the workpiece W. Thus, even in a case where the workpiece W has a complicated shape, a thin film is uniformly formed on the entire surface of the workpiece W having the complicated shape.

When the sputtering is performed by the sputtering device 70 for a predetermined time, the surface treatment device 1*a* stops the sputtering performed by the sputtering device 70.

Then, the surface treatment device 1*a* stops the driving of the servomotor 120 to end the swinging of the housing unit 100 (Step ST23). At that time, the housing unit support member 110 stops at the neutral position, that is, in the state illustrated in FIG. 12.

When the sputtering device 70 is stopped and the housing unit support member 110 is also stopped, the surface treatment device 1*a* causes the pressure in the chamber 10 to be equal to the atmospheric pressure (Step ST24). When the pressure in the chamber 10 is made equal to the atmospheric pressure, the pump unit 140 is stopped, and a pressure adjustment valve (not illustrated) installed in the chamber 10 is opened to take air around the chamber 10 into the chamber 10. As a result, the pressure in the chamber 10 that has been reduced is increased, and the pressure in the chamber 10 is made equal to the atmospheric pressure.

When the pressure in the chamber 10 is made equal to the atmospheric pressure, the second opening/closing member 30 is opened, and the housing unit 100 is taken out (Step ST25). Since the pressure in the chamber 10 is made substantially equal to the atmospheric pressure outside the chamber 10, the second opening/closing member 30 can be easily opened by rotating around the hinge portion 31. When the second opening/closing member 30 is opened, the housing unit 100 housed in the chamber 10 is taken out to the outside of the chamber 10 through the opening 11 of the chamber 10. As the plasma generation device 40 performs surface modification and then the sputtering device 70 performs sputtering by a series of processing described above, the workpiece W on which the thin film with a high degree of adhesion for the plating layer is formed when plating is performed in the subsequent step is obtained.

The workpiece W having a surface on which the thin film is formed is subjected to plating in the subsequent step. The plating is performed by, for example, a method such as electrolytic plating, electroless plating, or hot dipping. Since these types of plating are performed on the workpiece W on which the thin film is formed by the series of surface treatments described above, a metal thin film (plating layer) covering the surface by the plating can be formed with a high degree of adhesion for the thin film formed on the surface of the workpiece W.

As described above, the surface treatment device 1*a* of the first embodiment stirs the workpiece W housed in the housing unit 100 by swinging the housing unit 100 by the servomotor 120 (stirring means) when the plasma generation device 40 or the sputtering device 70 (both of them are the surface treatment means) performs the surface treatment on the workpiece W. Therefore, even in a case where the workpiece W housed in the housing unit 100 is a small three-dimensional component, the surface treatment can be uniformly performed on the entire surface.

In the surface treatment device 1*a* of the first embodiment, the servomotor 120 (stirring means) swings the housing unit 100 around the swing shafts 111. Therefore, since the workpiece W housed in the housing unit 100 is stirred, even in a case where the workpiece W housed in the housing unit 100 is a small three-dimensional component, the surface treatment can be uniformly performed on the entire surface.

In addition, in the surface treatment device 1*a* of the first embodiment, the housing unit 100 is installed below the plasma generation device 40 or the sputtering device 70 (both of them are the surface treatment means). Then, the servomotor 120 (stirring means) swings the housing unit 100 around the swing shafts 111 penetrating in a direction parallel to the surface treatment means, and thus the workpiece W housed in the housing unit 100 is stirred, such that the surface treatment can be uniformly performed on the entire surface of the workpiece W.

Note that, since the plasma generation device 40 and the sputtering device 70 are independently positioned outside the housing unit 100, the surface treatment device 1*a* can perform different surface treatments on the workpiece W by performing switching between the plasma generation device 40 and the sputtering device 70. In addition, the degree of freedom in designing the housing unit 100 is improved. Furthermore, since the plasma generation device 40 is independently positioned outside the housing unit 100, for example, a wiring structure of the electrodes (the pair of plate-shaped conductor portions 51 and 52) included in the plasma generation device 40 is simplified, thereby improving the degree of freedom in designing the electrodes.

In addition, in the surface treatment device 1*a* of the first embodiment, the housing unit 100 has a shape that is narrower toward the bottom portion. Therefore, when the housing unit 100 housing the workpiece W swings, the workpiece W easily moves along the end portion of the side wall 102 (102*a*, 102*b*, or 102*c*). That is, the workpiece W is easily stirred. Therefore, the surface of the workpiece W can be uniformly irradiated with the plasma emitted from the plasma generation device 40. In addition, the atoms emitted from the target 84 of the sputtering device 70 can be uniformly applied to the surface of the workpiece W. As a result, the entire surface of the workpiece W can be uniformly subjected to the surface treatment.

In addition, in the surface treatment device 1*a* of the first embodiment, the surface treatment means is the plasma generation device 40 that performs the surface treatment of the workpiece W by irradiating the workpiece W housed in the housing unit 100 with plasma. Therefore, the surface modification (surface treatment) using plasma can be reliably performed on the workpiece W.

In addition, in the surface treatment device 1*a* of the first embodiment, the surface treatment means is the sputtering device 70 that performs pattering on the workpiece W housed in the housing unit 100. Therefore, the sputtering can be reliably performed on the workpiece W.

Note that, although a specific form is not indicated, the housing unit 100 and the plasma generation device 40 may integrally swing. In addition, the housing unit 100 and the sputtering device 70 may integrally swing. Specifically, when the first opening/closing member 20 is closed, the plasma generation device 40 and the housing unit 100 are engaged with each other to be integrated, and swing around the swing shafts. At that time, the support member 46, and the gas supply pipe 41 and the gas flow path 42 formed inside the support member 46 are formed of a flexible material, such that it is possible to implement swinging with a high degree of freedom.

Specifically, when the second opening/closing member 30 is closed, the sputtering device 70 and the housing unit 100 are engaged with each other to be integrated, and swing around the swing shafts. At this time, the cooling water pipe 71, the cooling water path 72 formed inside the cooling water pipe 71, and the support member 76 are formed of a flexible material, such that it is possible to implement swinging with a high degree of freedom.

As described above, the housing unit 100 can swing in a state in which the workpiece W is always kept within a treatment range of the surface treatment means by integrally swinging the housing unit 100 and the surface treatment means, such that both the surface treatment and the stirring of the workpiece W can be performed more efficiently.

2. Modification of First Embodiment

Figure 22:
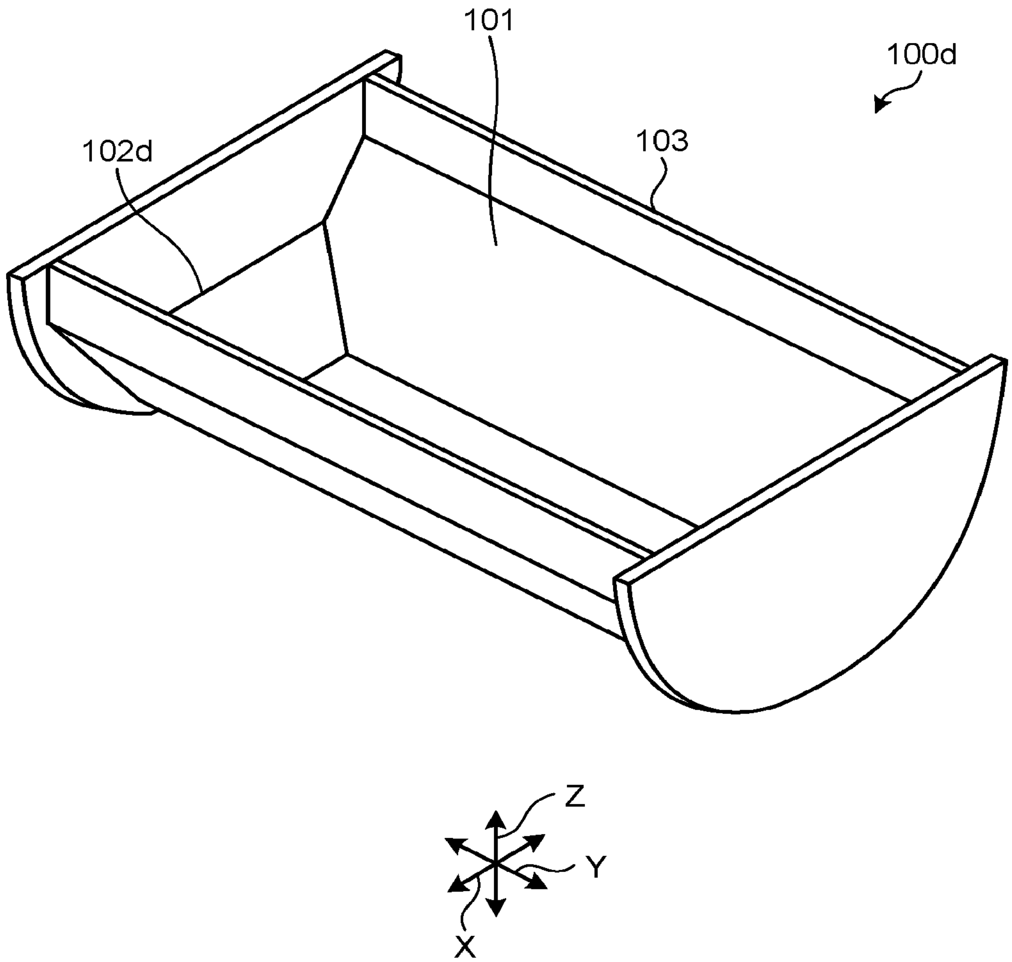
FIG. 22 is a perspective view of a housing unit according to another embodiment.
Figure 23:
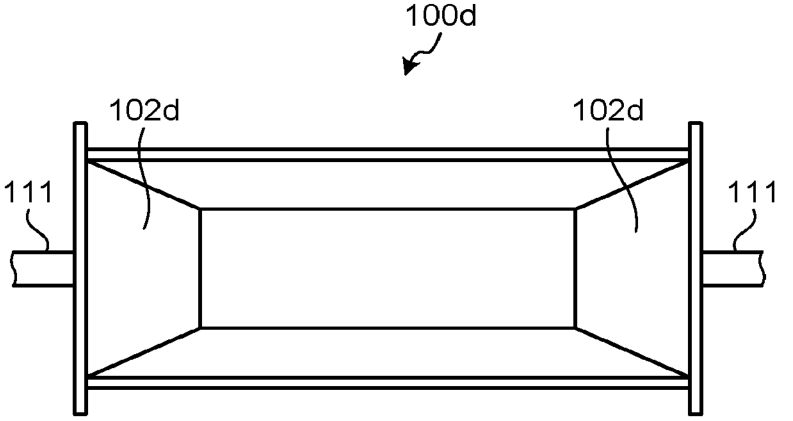
FIG. 23 is a top and side view of the housing unit of FIG. 22.
Figure 23:
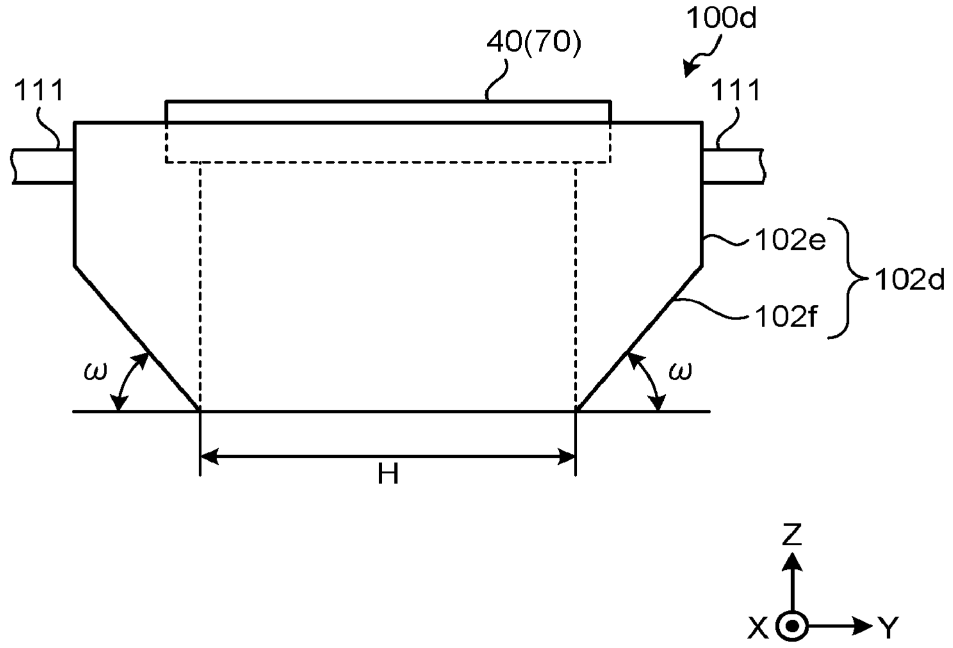

The shape of the housing unit 100 is not limited to that illustrated in FIG. 13 or 16. FIG. 22 is a perspective view of a housing unit according to another embodiment. FIG. 23 is a top and side view of the housing unit of FIG. 22.

As illustrated in FIG. 22, a housing unit 100*d* is different from the housing unit 100 in that the housing unit 100*d* has the side wall 102*d*, in contrast to the side wall 102 (see FIG. 13) of the housing unit 100, having an inclination so that the area of a portion in which the workpiece W is housed gradually decreases toward a bottom portion of the housing unit 100*d*.

As illustrated at (b) in FIG. 23, the side wall 102*d* includes a vertical side wall 102*e* and a side wall 102*f* inclined toward the bottom portion of the housing unit 100*d*. Note that the side wall 102*d* is provided on each of opposite end sides of the housing unit 100*d* in a Y axis direction. The side walls 102*d* at the opposite ends of the housing unit 100*d* have the same shape. That is, the width H of the side wall 102*d* along a Y axis decreases from an upper side toward a lower side of the housing unit 100*d*. The side wall 102*d* is formed of, for example, a member having a large number of holes, such as a punching plate. Note that the inclination of the side wall 102*d*, that is, an angle @ illustrated at (b) in FIG. 23 is set to about 30° to 80°.

By using the housing unit 100*d* having such a shape, stirring of the workpiece W is further promoted when the housing unit 100*d* swings. In particular, by using the housing unit 100*d*, the workpiece W effectively turns over.

Furthermore, as illustrated at (b) in FIG. 23, the side wall 122*d* is formed so that the width H along the Y axis at the bottom portion of the housing unit 100*d* is substantially equal to an effective range in which the surface treatment is more efficiently performed when the plasma generation device 40 and the sputtering device 70, which are the surface treatment means, perform the surface treatment. That is, the side wall 102*d* has an inclination outside the above-described effective range in a region where the bottom portion of the housing unit 100*d* faces the plasma generation device 40 and the sputtering device 70 (surface treatment means).

As described above, in the surface treatment device 1*a* according to the modification of the first embodiment, the side wall 102*d* of the housing unit 100*d* at the swing shaft 111 is formed so that the area of the portion in which the workpiece W is housed decreases toward the bottom portion of the housing unit 100*d*. Therefore, the stirring of the workpiece W is further promoted, such that it is possible to make the surface of the workpiece W evenly face the plasma generation device 40 and the sputtering device 70. As a result, the workpiece W can be subjected to surface treatment more uniformly.

In addition, in the surface treatment device 1*a* according to the modification of the first embodiment, the side wall 102*d* has an inclination outside the effective range in which the surface treatment is efficiently performed in the region where the bottom portion of the housing unit 100*d* faces the plasma generation device 40 and the sputtering device 70 (surface treatment means). Therefore, when the housing unit 100*d* swings, the workpiece W can be efficiently held in the region facing the surface treatment means, such that the efficiency of the surface treatment can be further improved.

3. Second Embodiment

Figure 24:
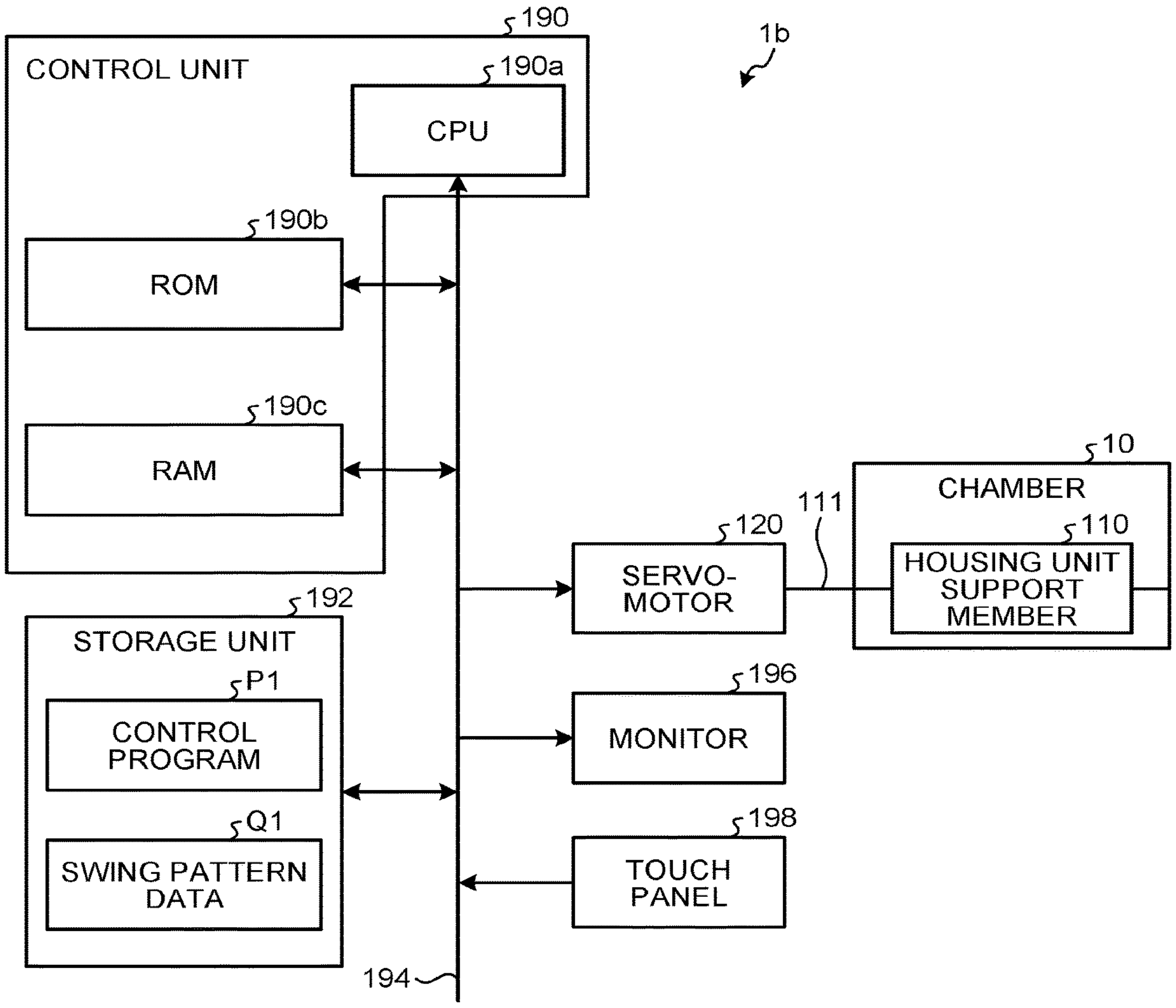
FIG. 24 is a hardware block diagram for describing a hardware configuration of a surface treatment device according to a second embodiment.
Figure 25:
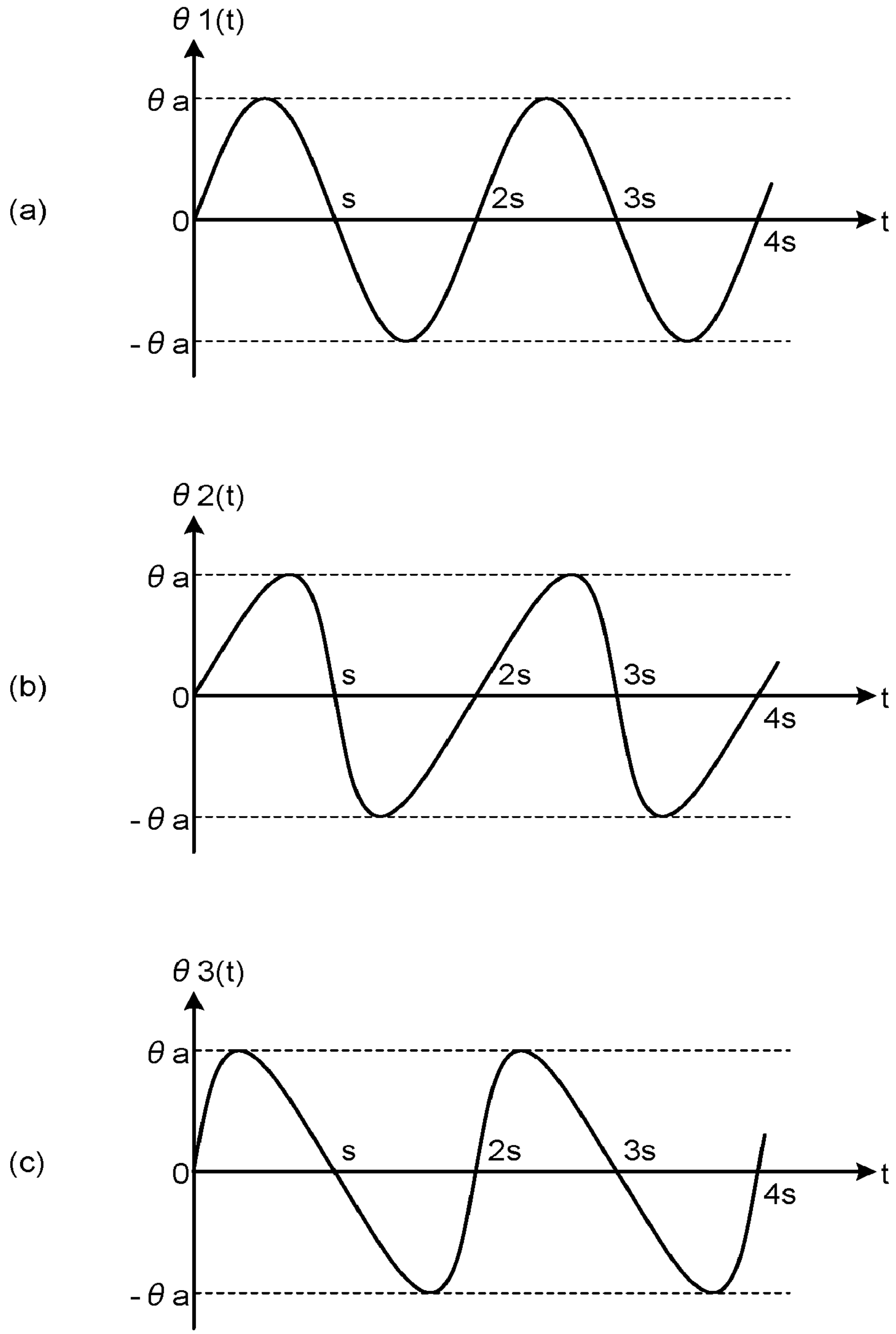
FIG. 25 is a diagram illustrating a specific example of a swing pattern.

A surface treatment device 1*b* according to the second embodiment of the present disclosure will be described with reference to FIGS. 24 and 25. FIG. 24 is a hardware block diagram for describing a hardware configuration of the surface treatment device according to the second embodiment. FIG. 25 is a diagram illustrating a specific example of a swing pattern.

The surface treatment device 1*b* has a hardware configuration illustrated in FIG. 24, and has an additional function of ordering the swing pattern when a housing unit 100 swings, unlike the surface treatment device 1*a*. More specifically, a control unit 190 that controls an operation of a servomotor 120 further functions as an instruction means that orders the swing pattern.

That is, the surface treatment device 1*b* has a configuration in which the control unit 190, a storage unit 192, a monitor 196, and a touch panel 198 are added to the surface treatment device 1*a* described above.

The control unit 190 includes a central processing unit (CPU) 190*a*, a read only memory (ROM) 190*b*, and a random access memory (RAM) 190*c*. The CPU 190*a* is connected to the ROM 190*b* and the RAM 190*c* via an internal bus 194. The CPU 190*a* loads various programs stored in the ROM 190*b* or the storage unit 192 in the RAM 190*c*. The CPU 190*a* is operated according to various programs load in the RAM 190*c* to control the servomotor 120. That is, the control unit 190 has a configuration of a general computer.

The control unit 190 is further connected to the storage unit 192, the monitor 196, the touch panel 198, and the servomotor 120 via the internal bus 194.

The storage unit 192 is a non-volatile memory such as a flash memory, a hard disk drive (HDD), or the like that retains stored information even when a power supply is turned off. The storage unit 192 stores a control program P1 and swing pattern data Q1.

The control program P1 is a program for controlling the operation of the servomotor 120. The swing pattern data Q1 is a data file that stores a drive waveform when the servomotor 120 is driven. Note that a drive output of the servomotor 120 is transmitted to a housing unit support member 110 installed inside a chamber 10 via a swing shaft 111. Then, the housing unit support member 110 and the housing unit 100 (not illustrated in FIG. 21) installed inside the housing unit support member 110 integrally swing. Note that the swing pattern data Q1 will be described later in detail.

The monitor 196 and the touch panel 198 function as display operation means by which an operator of the surface treatment device 1*b* gives an instruction necessary for operating the surface treatment device 1*b* and which displays an operation state of the surface treatment device 1*b*. Specifically, the monitor 196 includes, for example, a liquid crystal panel, and the touch panel 198 overlaps a surface of the monitor 196. Note that a keyboard may be provided instead of the touch panel 198.

As illustrated in FIG. 25, the swing pattern data Q1 stores a plurality of swing patterns θ1(*t*), θ2(*t*), and θ3(*t*). 25 illustrates, at (a), a general sine wave. That is, the swing pattern θ1(*t*) causes the housing unit 100 to swing, in which a time s corresponds to a half cycle, and a time 2 s corresponds to one cycle.

FIG. 25 illustrates, at (b), an example of the swing pattern θ2(*t*) in which a vertex of a triangular wave is blunt. As the housing unit 100 swings according to such a swing pattern θ2(*t*), the housing unit 100 moves quickly when θ2(*t*) reaches an angle −θa from an angle θa, and the housing unit 100 moves slowly when θ2(*t*) reaches the angle θa from the angle −θa. As a result, the workpiece W housed in the housing unit 100 is strongly accelerated in the vicinity of a speed change point (in the vicinity of a position where a sign of a differential coefficient of the swing pattern θ2(*t*) is changed), such that the workpiece W is more easily stirred.

FIG. 25 illustrates, at (c), an example of the swing pattern θ3(*t*) in which a vertex of a triangular wave is blunt. The swing pattern θ2(*t*) and the swing pattern θ3(*t*) have different speed patterns when the housing unit 100 swings. That is, according to the swing pattern θ3(*t*), the housing unit 100 moves slowly when θ3(*t*) reaches the angle −θa from the angle θa, and the housing unit 100 moves quickly when θ3(*t*) reaches the angle θa from the angle −θa. As a result, the workpiece W housed in the housing unit 100 is strongly accelerated in the vicinity of a speed change point (in the vicinity of a position where a sign of a differential coefficient of the swing pattern θ3(*t*) is changed), such that the workpiece W is more easily stirred.

The operator of the surface treatment device 1*b* selects one of the plurality of swing patterns θ1(*t*), θ2(*t*), and θ3(*t*) displayed on the monitor 196 through the touch panel 198, for example. Then, the control unit 190 drives the servomotor 120 according to the selected swing pattern, thereby swinging the housing unit 100.

Note that, although a specific example of the swing pattern data Q1 is not limited to the example illustrated in FIG. 25, it is desirable to apply a swing pattern that rapidly changes the acceleration of the housing unit 100 in order to efficiently stir the workpiece W.

As described above, in the surface treatment device 1*b* of the second embodiment, the control unit 190 (instruction means) orders the swing pattern of the housing unit 100. Therefore, the housing unit 100 can swing according to an arbitrary swing pattern set in advance. As a result, the workpiece W housed in the housing unit 100 can be stirred more efficiently.

Further, although a mode in which the plasma generation device 40 and the sputtering device 70 are provided as the surface treatment means has been described, another surface treatment means may be further provided in the surface treatment devices 1*a* and 1*b* according to the above-described embodiments. In this case, the hinge portions attached to different surface treatment means may be disposed in the chamber 10 at appropriate intervals according to the shape of each surface treatment means or the chamber 10. That is, it is sufficient that a plurality of surface treatment means attached to the chamber 10 via the hinge portions in an openable and closable manner can be alternately positioned in the chamber 10, and in a state in which the surface treatment means are positioned outside the chamber 10, the surface treatment means can be positioned outside the chamber 10 without interfering with other surface treatment means.

EXPLANATIONS OF LETTERS OR NUMERALS

1*a*, 1*b* SURFACE TREATMENT DEVICE
10 CHAMBER
11 OPENING
12 UPPER WALL
13 SIDE WALL
14 SUPPORT WALL
15 BOTTOM PORTION
16 GAS INFLOW PORTION
20 FIRST OPENING/CLOSING MEMBER
21 HINGE PORTION
30 SECOND OPENING/CLOSING MEMBER
31 HINGE PORTION
40 PLASMA GENERATION DEVICE (SURFACE TREATMENT MEANS)
41 GAS SUPPLY PIPE
42 GAS FLOW PATH
43 GAS SUPPLY HOLE
44 GAS SUPPLY PORTION
45 GAS SUPPLY PIPE ATTACHMENT MEMBER
46 SUPPORT MEMBER
50 SUPPORT PLATE
50*a* RECESS PORTION
51, 52 PLATE-SHAPED CONDUCTOR PORTION
53, 54 THROUGH HOLE
55 SPACER
56 GAP PORTION
57 GAS INTRODUCTION PORTION
58 HOLDING MEMBER
60 MATCHING BOX (MB)
61 RADIO FREQUENCY POWER SUPPLY (RF)
63 GROUND
64 MASS FLOW CONTROLLER (MFC)

70 SPUTTERING DEVICE (SURFACE TREATMENT MEANS)
71 COOLING WATER PIPE
72 COOLING WATER PATH
73 WATER INLET
74 WATER OUTLET
75 COOLING WATER PIPE ATTACHMENT MEMBER
76 SUPPORT MEMBER
80 SUPPORT PLATE
81 MAGNET
82 COOLING JACKET
83 INSULATING MATERIAL
84 TARGET
85 HOLDING MEMBER
100, 100*a*, 100*b*, 100*c*, 100*d* HOUSING UNIT
101 WORKPIECE HOLDING WALL
102, 102*a*, 102*b*, 102*c*, 102*d*, 102*e*, 102*f* SIDE WALL
103 OPENING
104 ATTACHMENT PLATE
110 HOUSING UNIT SUPPORT MEMBER
111 SWING SHAFT
112 SIDE PLATE
113 ATTACHMENT MEMBER
114 SWINGING MEANS SHAFT CONNECTION PORTION
115 SUPPORT SHAFT CONNECTION PORTION
116 SUPPORT SHAFT
117 SUPPORT SHAFT SUPPORT MEMBER
120 SERVOMOTOR (STIRRING MEANS)
121 OUTPUT SHAFT
122 SERVOMOTOR ATTACHMENT MEMBER
125 DRIVE SHAFT
130*a* CORRECTION PLATE
132 ATTACHMENT PORTION
140 PUMP UNIT
141 ATTACHMENT FLANGE
143 DRIVING MEANS SUPPORT PORTION
150 FLOW RATE ADJUSTMENT VALVE
151 FLOW PATH PORTION
152 OPENING
153 LIFTING VALVE
155 ADJUSTMENT OPENING
160 SERVO ACTUATOR
161 WORM JACK
162 LIFTING SHAFT
163 CONNECTION MEMBER
165 VALVE GUIDE
166 GUIDE ENGAGEMENT PORTION
170 TURBO MOLECULAR PUMP
171 PUMP FLANGE
180 VACUUM GAUGE
190 CONTROL UNIT (INSTRUCTION MEANS)
192 STORAGE UNIT
H WIDTH
R HOUSING SPACE
W WORKPIECE
$\theta 1(t)$, $\theta 2(t)$, $\theta 3(t)$ SWING PATTERN
$\omega$ ANGLE

The invention claimed is:

1. A surface treatment device, comprising:
- a housing unit which houses a workpiece;
- a surface treatment means which performs a surface treatment on the workpiece housed in the housing unit; and
- a stirring means which stirs the workpiece when the surface treatment means performs the surface treatment on the workpiece such that an entire surface of the workpiece is subjected to the surface treatment, wherein
- the stirring means swings the housing unit around a swing shaft extending in a direction parallel to the surface treatment means, the swing shaft being connected to a side of the housing unit without extending into a housing space of the housing unit,
- the swing shaft is installed between the surface treatment means and a bottom of the housing unit, the workpiece located at the bottom of the housing unit, and
- the housing unit opens upward toward the surface treatment means.

2. The surface treatment device according to claim 1, further comprising an instruction means which is configured to order a swing pattern of the housing unit or the housing unit and the surface treatment means, wherein
- the stirring means stirs the workpiece according to the swing pattern ordered by the instruction means.

3. The surface treatment device according to claim 1, wherein the housing unit has a shape that is narrower toward a bottom portion.

4. The surface treatment device according to claim 3, wherein a side wall of the housing unit at the swing shaft is formed to have an area of a portion in which the workpiece is housed decrease toward the bottom portion of the housing unit.

5. The surface treatment device according to claim 4, wherein the side wall has an inclination outside an effective range in which the surface treatment is efficiently performed in a region where the bottom portion of the housing unit and the surface treatment means face each other.

6. The surface treatment device according to claim 1, wherein the surface treatment means is a plasma generation device that performs the surface treatment of the workpiece by irradiating the workpiece housed in the housing unit with plasma.

7. The surface treatment device according to claim 6, wherein an electrode of the plasma generation device is installed outside a housing space of the workpiece in the housing unit independently of the housing space.

8. The surface treatment device according to claim 1, wherein the surface treatment means is a sputtering device that performs sputtering on the workpiece housed in the housing unit.

9. The surface treatment device according to claim 1, wherein the swing shaft includes two swing shafts each connected to one side of the housing unit.

10. The surface treatment device according to claim 1, wherein the housing unit has an opening that opens upward toward the surface treatment means, and
- the surface treatment means is arranged at the opening.

11. The surface treatment device according to claim 10, wherein at least a portion of the surface treatment means is arranged within the opening.

12. A surface treatment device, comprising:
- a housing unit which houses a workpiece;
- a surface treatment means which performs a surface treatment on the workpiece housed in the housing unit; and
- a stirring means which stirs the workpiece when the surface treatment means performs the surface treatment on the workpiece such that an entire surface of the workpiece is subjected to the surface treatment, wherein
- the stirring means swings the housing unit around a swing shaft extending in a direction parallel to the surface treatment means, the swing shaft being connected to a side of the housing unit without extending into a housing space of the housing unit, and swings the housing unit and the surface treatment means, and the housing unit opens upward toward the surface treatment means.

13. The surface treatment device according to claim 12, wherein the housing unit has an opening that opens upward toward the surface treatment means, and the surface treatment means is arranged at the opening.

* * * * *